(12) United States Patent
Hirota

(10) Patent No.: US 8,415,725 B2
(45) Date of Patent: Apr. 9, 2013

(54) SOLID-STATE IMAGING DEVICE AND CAMERA

(75) Inventor: Isao Hirota, Kanagawa (JP)

(73) Assignee: Sony Corporation, Tokyo (JP)

( * ) Notice: Subject to any disclaimer, the term of this patent is extended or adjusted under 35 U.S.C. 154(b) by 490 days.

(21) Appl. No.: 12/124,468

(22) Filed: May 21, 2008

(65) Prior Publication Data

US 2008/0290382 A1 Nov. 27, 2008

(30) Foreign Application Priority Data

May 24, 2007 (JP) ................................. 2007-137446
May 24, 2007 (JP) ................................. 2007-137447

(51) Int. Cl.
*H01L 31/113* (2006.01)
(52) U.S. Cl.
USPC ........... 257/291; 257/228; 257/290; 257/292; 257/293; 257/294; 257/446; 257/447; 257/460; 257/E27.122; 257/E27.13; 257/E27.133; 257/E31.11; 257/E31.127; 348/294
(58) Field of Classification Search .......... 257/290–292, 257/294, 431, 443–446, 461, 462, E27.127, 257/E27.13, E27.133, E27.139, 288, 215, 257/225, 428, E31.11, E27.122, E31.127; 348/294
See application file for complete search history.

(56) References Cited

U.S. PATENT DOCUMENTS

| | | |
|---|---|---|
| 6,784,933 B1 | 8/2004 | Nakai |
| 2005/0179053 A1* | 8/2005 | Ezaki et al. ................... 257/189 |
| 2006/0043519 A1* | 3/2006 | Ezaki ........................... 257/461 |
| 2006/0187327 A1* | 8/2006 | Mabuchi et al. .............. 348/294 |
| 2006/0197007 A1* | 9/2006 | Iwabuchi et al. .......... 250/208.1 |
| 2006/0255240 A1* | 11/2006 | Etoh ......................... 250/208.1 |

FOREIGN PATENT DOCUMENTS

| | | |
|---|---|---|
| EP | 0038697 | 10/1981 |
| EP | 0038697 | 10/1982 |
| JP | 60-140752 | 7/1985 |
| JP | 64-014959 | 1/1989 |
| JP | 02-304973 | 12/1990 |
| JP | 04-280676 | 10/1992 |
| JP | 06-120473 | 4/1994 |
| JP | 6-66446 | 8/1994 |
| JP | 07-078959 | 3/1995 |
| JP | 2935492 | 6/1996 |
| JP | 09-082933 | 3/1997 |
| JP | 2692218 | 9/1997 |
| JP | 2003-017677 | 1/2003 |
| JP | 2003-078826 | 3/2003 |
| JP | 2004-259733 | 9/2004 |
| JP | 2004259733 | 9/2004 |
| JP | 2004259733 A * | 9/2004 |
| JP | 2005-085999 | 3/2005 |

(Continued)

OTHER PUBLICATIONS

European Search Report corresponding to European Serial No. 08008921.2 dated Apr. 27, 2010.
Search Report issued by the European Patent Office on Jun. 22, 2009 in connection to related European Patent Application No. 08008921.2.

(Continued)

*Primary Examiner* — Matthew Reames
*Assistant Examiner* — Ermias Woldegeorgis
(74) *Attorney, Agent, or Firm* — SNR Denton US LLP

(57) ABSTRACT

A solid-state imaging device including: a substrate; a light-receiving part; a second-conductivity-type isolation layer; a detection transistor; and a reset transistor.

17 Claims, 23 Drawing Sheets

FOREIGN PATENT DOCUMENTS

| | | |
|---|---|---|
| JP | 2005-244434 | 9/2005 |
| JP | 2005-268644 | 9/2005 |
| JP | 3752773 | 12/2005 |
| JP | 2006-073682 | 3/2006 |
| JP | 2006-319003 | 11/2006 |

OTHER PUBLICATIONS

Japanese Office Action issued on Mar. 6, 2012, in connection with counterpart JP Application No. 2007-137446.

* cited by examiner

FRONT-IRRADIATION BMCD

BACK-IRRADIATION BMCD OF EMBODIMENT OF PRESENT INVENTION

FIG. 5

ENERGY DIAGRAM (i) GATE ACCUMULATION/ NON-READING-OUT
- -2V IS APPLIED TO DRAIN AND GATE IN SOURCE-FOLLOWER STATE.
- HOLES ARE ACCUMULATED IN HOLE POCKET.
- ELECTRON INJECTION FROM SOURCE TO CHANNEL IS STARTED.

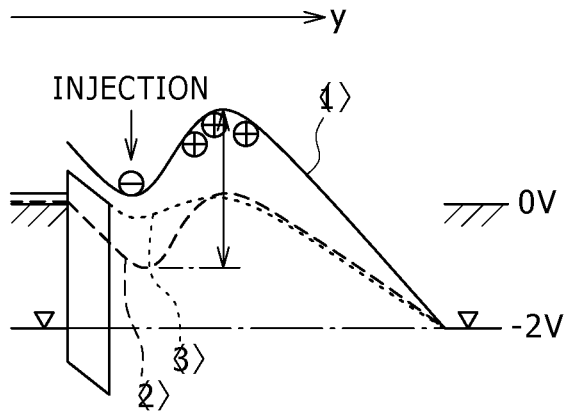

(ii) GATE READING-OUT
- GATE VOLTAGE IS CHANGED FROM -2V TO 0V AND CHANNEL CURRENT CHANGE IS MEASURED TO READ OUT ACCUMULATED CHARGE.

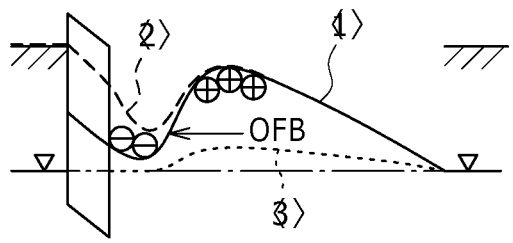

(iii) RESET
- NEGATIVE VOLTAGE IS APPLIED TO HOLE DRAIN AND RESET GATE TO EXTRACT ACCUMULATED HOLES.

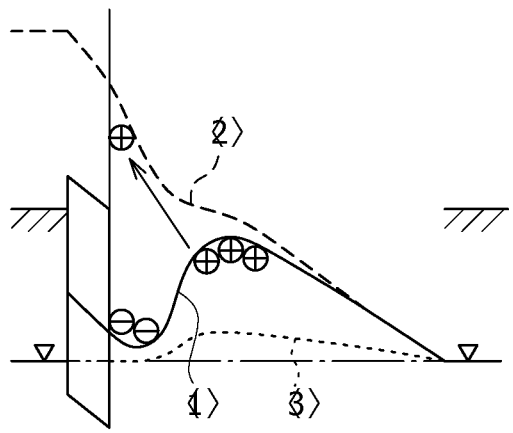

——— ①: POTENTIAL CHANGE ALONG LINE $A_1$-$A_2$
- - - ②: POTENTIAL CHANGE ALONG LINE $B_1$-$B_2$
····· ③: POTENTIAL CHANGE ALONG LINE $C_1$-$C_2$
▽ DRAIN POTENTIAL

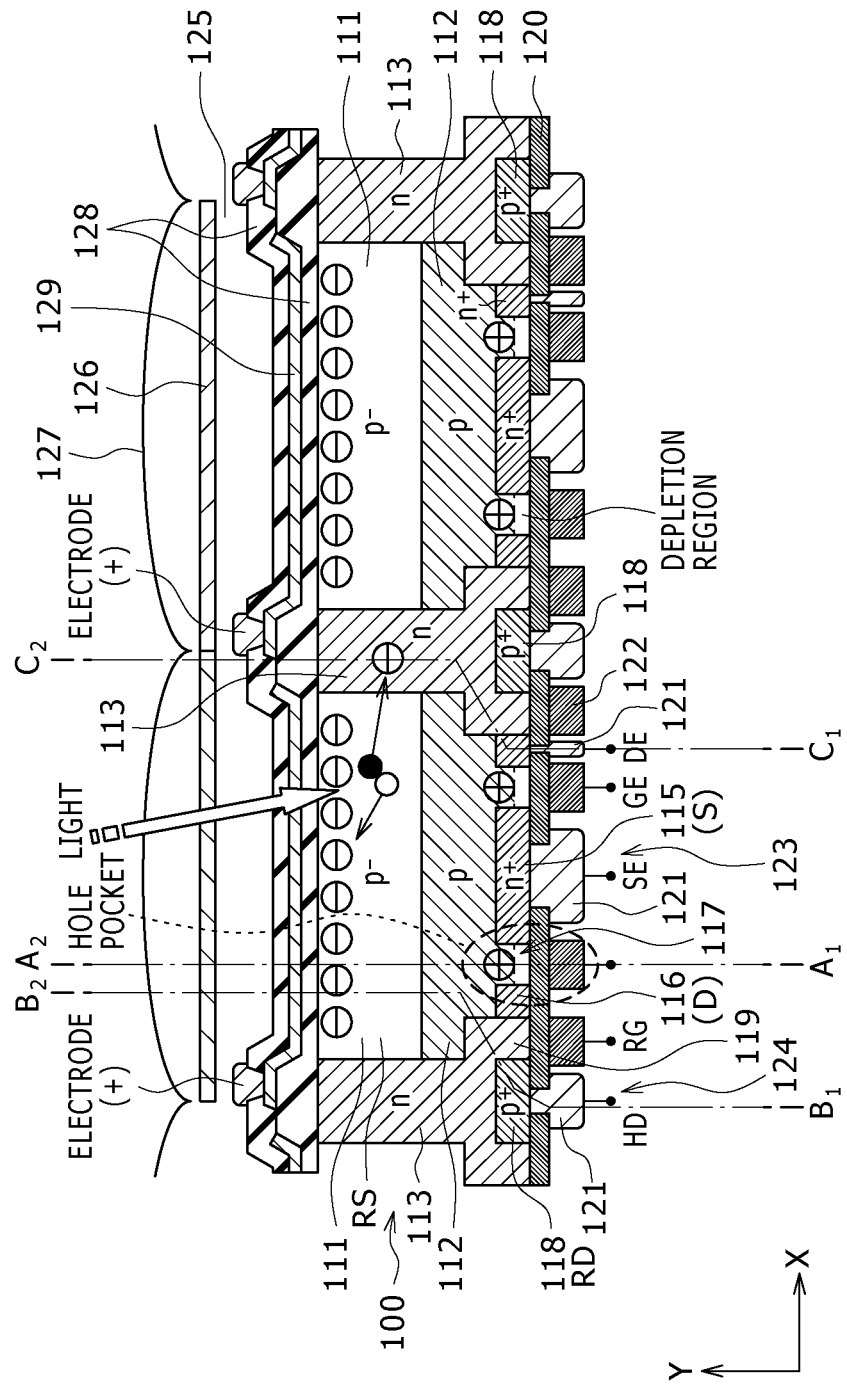

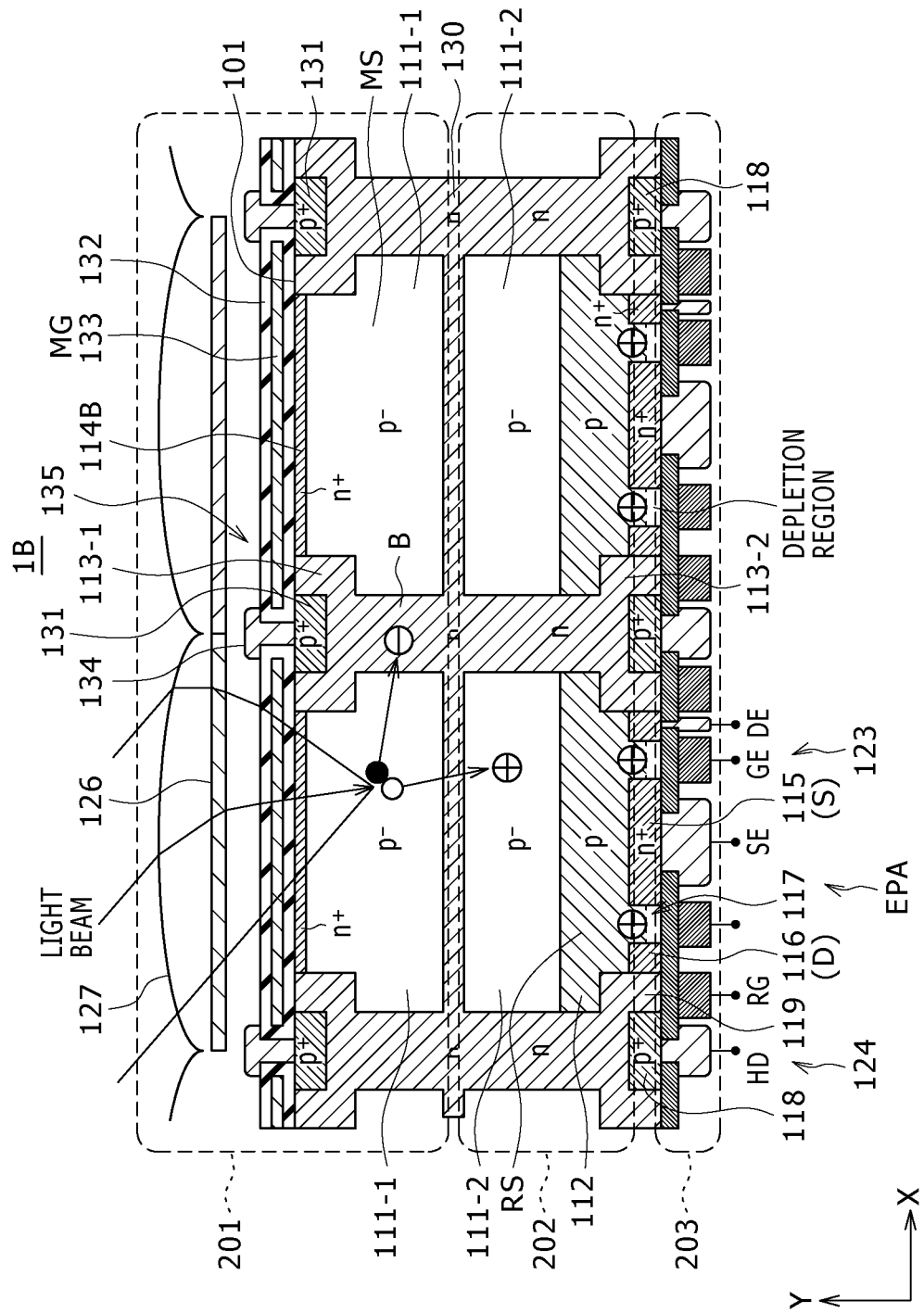

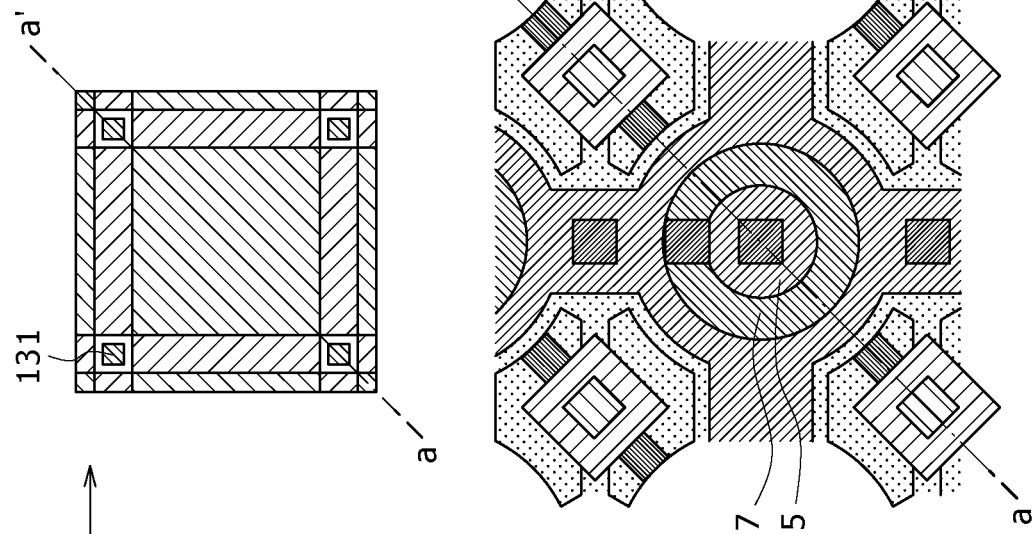
FIG.12A SENSOR PLANE
FIG.12C TRANSISTOR ARRANGEMENT PLANE
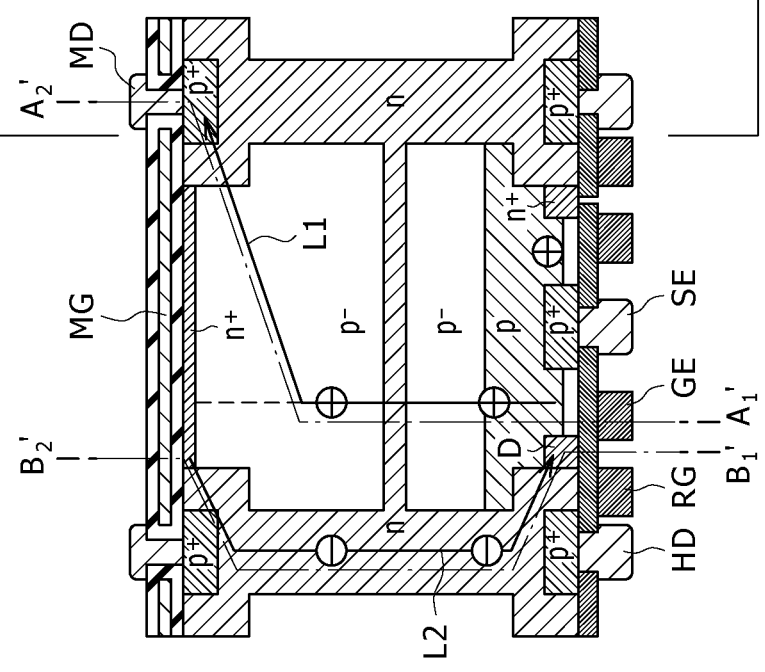
FIG.12B SECTIONAL VIEW ALONG LINE a-a'

COMBINATION WITH MECHANICAL SHUTTER

ALL-ELECTRONIC SHUTTER WITH USE OF MEMORY (i) GLOBAL RESET (ii) LIGHT RECEPTION AND ACCUMULATION (MEMORY)

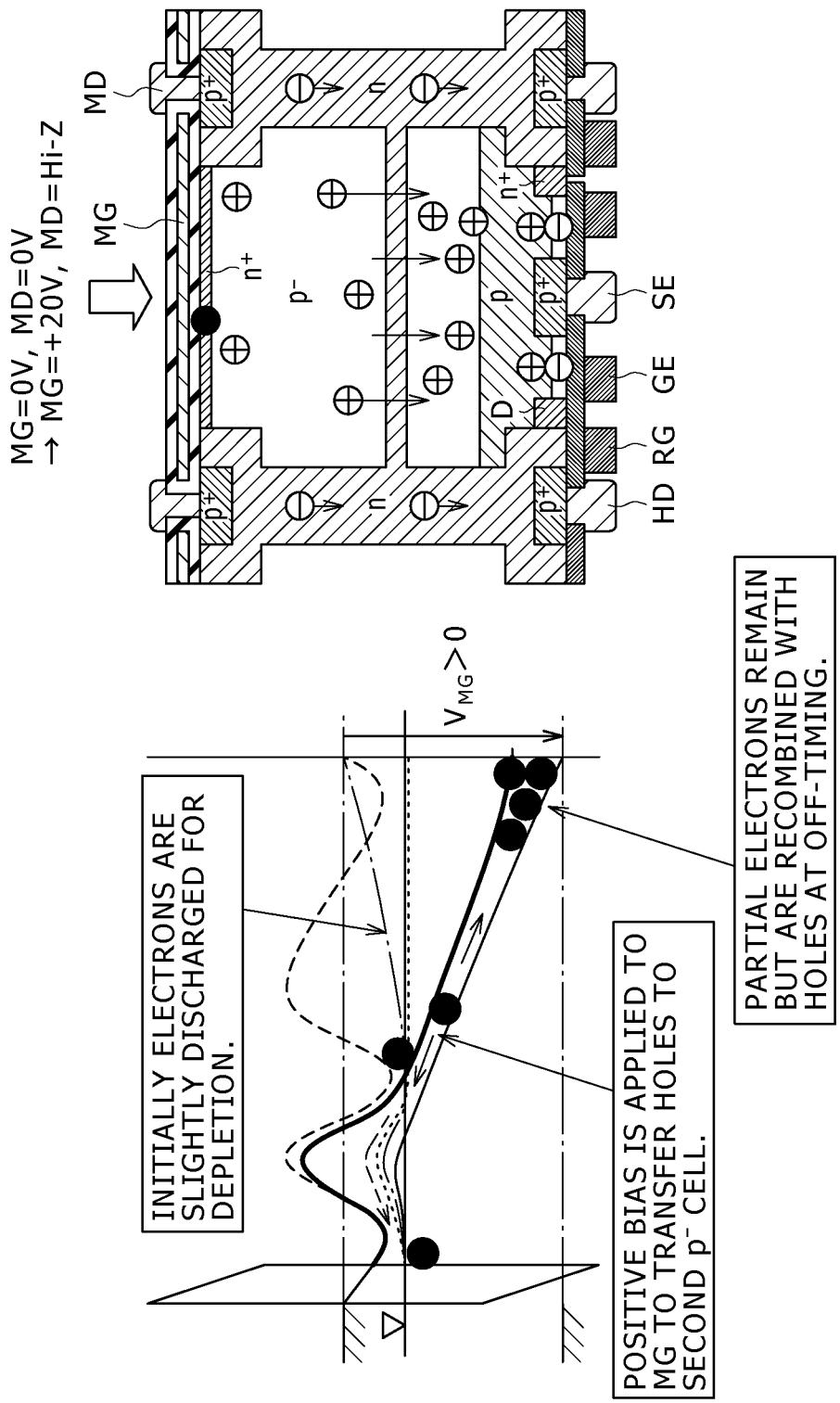

DRIVE TIMING

DRIVE CIRCUIT DIAGRAM

SOLID-STATE IMAGING DEVICE AND CAMERA

CROSS REFERENCES TO RELATED APPLICATIONS

The present invention contains subject matter related to Japanese Patent Applications No. 2007-137446 and No. 2007-137447 filed in the Japan Patent Office on May 24, 2007, the entire contents of which being incorporated herein by reference.

BACKGROUND OF THE INVENTION

1. Field of the Invention

The present invention relates to a solid-state imaging device having a photoelectric conversion element and a camera.

2. Description of the Related Art

It is known that, in a solid-state imaging device such as a CCD image sensor and a CMOS image sensor, a crystal defect in a photodiode as a photoelectric conversion element of a light-receiving part and the interface state at the interface between the light-receiving part and an insulating film thereon act as a source of dark current.

As a scheme for suppressing the generation of dark current attributed to the interface state, a buried photodiode structure is effective. This buried photodiode is obtained in the following manner for example. Specifically, an n-type semiconductor region is formed. Subsequently, in the vicinity of the surface of this n-type semiconductor region, i.e., in the vicinity of the interface between the surface and an insulating film thereon, a shallow heavily-doped p-type semiconductor region (hole-accumulating region) for the dark current suppression is formed.

In a general method for fabricating the buried photodiode, ion-implantation of B or $BF_2$ serving as a p-type impurity and annealing treatment are carried out to thereby fabricate the p-type semiconductor region in the vicinity of the interface of the n-type semiconductor region of the photodiode and the insulating film.

In a CMOS image sensor, each pixel includes a photodiode and transistors for various kinds of operation such as reading-out, reset, and amplification. A signal arising from photoelectric conversion by the photodiode is processed by these transistors. Over the respective pixels, an interconnect layer including multilayer metal interconnects is formed. Over the interconnect layer, a color filter that defines the wavelength of light incident on the photodiode and on-chip lenses for condensing light on the photodiode are formed.

As the structures of such a CMOS image sensor, device structures having various characteristics have been proposed.

Specifically, the following various devices have been proposed: a charge modulation device (CMD) obtained by employing CCD-like characteristics for a photoelectric conversion element structure (refer to Japanese Patent No. 1938092, Japanese Patent Laid-open No. Hei 6-120473, and Japanese Patent Unexamined Publication No. Sho 60-140752 (Patent Documents 1, 2, and 3, respectively)); a bulk charge modulation device (BCMD) (refer to Japanese Patent Utility Model Laid-open No. Sho 64-14959 (Patent Document 4)); a floating well amplifier (FWA) in which a channel is formed near the surface depending on the charge amount of photoholes accumulated at the maximal point and the source-drain current changes depending on the charge amount near the surface and consequently reading-out in accordance with the signal charge is permitted (refer to Japanese Patent No. 2692218 and Japanese Patent No. 3752773 (Patent Documents 5 and 6, respectively)); a threshold (Vth) modulation image sensor (VMIS) in which a light-receiving part and a signal detection part separated from each other are disposed adjacent to each other (refer to Japanese Patent Laid-open No. Hei 2-304973, Japanese Patent Laid-Open No. 2005-244434, Japanese Patent No. 2935492, and Japanese Patent Laid-Open No. 2005-85999 (Patent Documents 7, 8, 9, and 10, respectively)).

These CMOS image sensors are front-irradiation solid-state imaging devices that are irradiated with light from the front-face side thereof basically.

On the other hand, there has been proposed a back-irradiation solid-state imaging device (refer to Japanese Patent Laid-open No. 2003-31785 (Patent Document 11)). For this device, the backside of a silicon substrate in which photodiodes and various transistors are formed is polished to decrease the thickness of the substrate, to thereby allow light incidence on the substrate backside for photoelectric conversion.

SUMMARY OF THE INVENTION

In the above-described front-irradiation CMD, BCMD, FWA, and VMIS, the substrate is used for overflow. Therefore, the backside irradiation is impossible, and the reset voltage is high.

The front-irradiation CMD, BCMD, FWA, and VMIS involve a disadvantage that the aperture ratio is low because a light-receiving part and a pick-up transistor are disposed side by side.

Furthermore, existing photogate structures involve a disadvantage that the sensitivity to blue is low because light is received through a thin film gate.

If a photogate MOS transistor is formed on an $n^-$ layer in a front-irradiation device like the BCMD, carrier generation due to light irradiation is carried out near the semiconductor surface, and thus carriers are captured by traps existing at the interface between the semiconductor and an insulating film. This leads to a disadvantage that the accumulated carriers are not rapidly discharged when the reset voltage is applied and thus device characteristics are adversely affected.

Furthermore, if a light-receiving photodiode region and a signal detection transistor are disposed adjacent to each other in a front-irradiation device like the VMIS, accumulation of the charge generated due to light reception and modulation operation are not dynamic operation but carried out in different times separately. Therefore, such a device is disadvantageous for high-speed signal processing.

In addition, if a light-receiving photodiode region and a signal detection transistor are disposed adjacent to each other in a front-irradiation device similarly, ingenuity such as provision of a light-shielding film over the signal detection part is required, which leads to a disadvantage of a complex element manufacturing process.

In the front-irradiation BCMD image sensor, the whole of the channel region under the photogate electrode serves as a charge accumulation layer, and therefore its current-voltage ($I_D$-$V_{DD}$) characteristic is not a saturation characteristic but a triode characteristic. This causes a disadvantage that this image sensor is difficult to use when it is used as a source-follower device.

Moreover, the above-described front-irradiation CMOS image sensors involve disadvantages that light is blocked by interconnects over the pixels and thus the sensitivity of each pixel is low, and that crosstalk and so forth is caused by the incidence of light reflected by these interconnects on adjacent pixels.

For the back-irradiation solid-state imaging device disclosed in Patent document 11, hole-accumulating regions are formed on both the front side and back side of the substrate. However, there is a limit to the formation of a shallow heavily-doped p-type semiconductor region through ion-implantation. Therefore, if further increasing of the impurity concentration of the p-type semiconductor region is attempted for dark current suppression, the p-type semiconductor region will range deeper. The deeper p-type semiconductor region leads to larger distance between the p-n junction of the photodiode and the transfer gate, and hence possibly lowers the ability of reading-out by the transfer gate.

There is a need for the present embodiment to provide a solid-state imaging device and a camera that are allowed to have enhanced sensitivity and miniaturized pixels while efficiently carrying out at high speed a series of operation including generation and accumulation of photo-carriers, charge reading-out, and sending-out of the residual charge (reset), and preventing the deterioration of the sensitivity to blue light and the influence of trapping of photo-carriers at the silicon interface.

According to a first embodiment of the present invention, there is provided a solid-state imaging device including a substrate configured to have a first substrate surface irradiated with light and a second substrate surface on which an element is formed, and a light-receiving part configured to be formed in the substrate and include a first-conductivity-type conductive layer. The light-receiving part receives light through the first substrate surface and has a photoelectric conversion function for received light and a charge accumulation function. The solid-state imaging device further includes a second-conductivity-type isolation layer configured to be formed on the side of the first-conductivity-type conductive layer of the light-receiving part, and a detection transistor configured to include a second-conductivity-type electrode layer formed in the first-conductivity-type conductive layer near the second substrate surface. The detection transistor detects an accumulated charge in the light-receiving part and has a threshold modulation function. The solid-state imaging device further includes a reset transistor configured to include a first-conductivity-type electrode layer formed in the second-conductivity-type isolation layer that is adjacent to the formation area of the detection transistor along the direction parallel to the substrate surface. The reset transistor further includes the second-conductivity-type isolation layer between the first-conductivity-type electrode layer and the second-conductivity-type electrode layer of the detection transistor adjacent to the second-conductivity-type isolation layer. The reset transistor further includes the first-conductivity-type conductive layer of the light-receiving part.

According to a second embodiment of the present invention, there is provided a solid-state imaging device including a substrate configured to have a first substrate surface irradiated with light and a second substrate surface on which an element is formed, and a light-receiving part configured to be formed in the substrate and include a first-conductivity-type conductive layer. The light-receiving part receives light through the first substrate surface and has a photoelectric conversion function for received light and a charge accumulation function. The solid-state imaging device further includes a second-conductivity-type isolation layer configured to be formed on the side of the first-conductivity-type conductive layer of the light-receiving part, and a detection transistor configured to include a second-conductivity-type electrode layer formed in the first-conductivity-type conductive layer near the second substrate surface. The detection transistor detects an accumulated charge in the light-receiving part and has a threshold modulation function. The solid-state imaging device further includes a reset transistor configured to include a first-conductivity-type electrode layer formed in the second-conductivity-type isolation layer that is adjacent to the formation area of the detection transistor along the direction parallel to the substrate surface. The reset transistor further includes the second-conductivity-type isolation layer between the first-conductivity-type electrode layer and the second-conductivity-type electrode layer of the detection transistor adjacent to the second-conductivity-type isolation layer. The reset transistor further includes the first-conductivity-type conductive layer of the light-receiving part. A first source region of a second conductivity type is formed in the first-conductivity-type conductive layer near the second substrate surface in each of cells isolated from each other, and a first drain region of the second conductivity type is formed to surround the first source region. The side of the first drain region remoter from the source side overlaps with a partial portion of the second-conductivity-type isolation layer along the direction parallel to the substrate surface. A first gate region surrounded by the first source region and the first drain region is formed. A second drain region as the first-conductivity-type electrode layer is formed in the second-conductivity-type isolation layer at a predetermined distance from the end of the first drain region remoter from the source side, and a second-conductivity-type region surrounded by the first drain region and the second drain region serves as a second gate region. An insulating film is selectively formed on the second substrate surface of the substrate in which the first source region, the first drain region, the first gate region, the second drain region, and the second gate region are formed. The detection transistor based on the first source region, the first gate region, and the first drain region and the reset transistor based on the second gate region, the second drain region, and the first-conductive-type conductive layer in the floating state as a source are formed across the second substrate surface.

According to a third embodiment of the present invention, there is provided a solid-state imaging device including a substrate configured to have a first substrate surface irradiated with light and a second substrate surface on which an element is formed, and a light-receiving part configured to be formed in the substrate and include a first-conductivity-type conductive layer. The light-receiving part receives light through the first substrate surface and has a photoelectric conversion function for received light and a charge accumulation function. The solid-state imaging device further includes a second-conductivity-type isolation layer configured to be formed on the side of the first-conductivity-type conductive layer of the light-receiving part, and an element area part configured to be formed in the light-receiving part near the second substrate surface and process an accumulated charge. The first-conductivity-type conductive layer of the light-receiving part is divided by a second-conductivity-type layer into two regions along the normal direction of the substrate, to thereby form a first region and a second region. A first-conductivity-type electrode layer is formed in the second-conductivity-type isolation layer that is adjacent to the first region along the direction parallel to the substrate surface. A transparent electrode to which bias voltage for developing a pinning function is applied is formed on the light-incident side of the first substrate surface. A memory transistor that includes the first-conductivity-type electrode layer, the second-conductivity-type isolation layer between the first region of the light-receiving part and the first-conductivity-type electrode layer, and the first region of the light-receiving part is formed.

According to a fourth embodiment of the present invention, there is provided a camera including a solid-state imaging device configured to receive light through a first substrate surface of a substrate, an optical system configured to guide incident light to the first substrate surface of the solid-state imaging device, and a signal processing circuit configured to process an output signal from the solid-state imaging device. The solid-state imaging device includes a light-receiving part that is formed in the substrate and includes a first-conductivity-type conductive layer. The light-receiving part receives light through the first substrate surface and has a photoelectric conversion function for received light and a charge accumulation function. The solid-state imaging device further includes a second-conductivity-type isolation layer that is formed on the side of the first-conductivity-type conductive layer of the light-receiving part, and a detection transistor that includes a second-conductivity-type electrode layer formed in the first-conductivity-type conductive layer near a second substrate surface of the substrate. The detection transistor detects an accumulated charge in the light-receiving part and has a threshold modulation function. The solid-state imaging device further includes a reset transistor that includes a first-conductivity-type electrode layer formed in the second-conductivity-type isolation layer that is adjacent to the formation area of the detection transistor along the direction parallel to the substrate surface. The reset transistor further includes the second-conductivity-type isolation layer between the first-conductivity-type electrode layer and the second-conductivity-type electrode layer of the detection transistor adjacent to the second-conductivity-type isolation layer. The reset transistor further includes the first-conductivity-type conductive layer of the light-receiving part.

According to a fifth embodiment of the present invention, there is provided a camera including a solid-state imaging device configured to receive light through a first substrate surface of a substrate, an optical system configured to guide incident light to the first substrate surface of the solid-state imaging device, and a signal processing circuit configured to process an output signal from the solid-state imaging device. The solid-state imaging device includes a light-receiving part that is formed in the substrate and includes a first-conductivity-type conductive layer. The light-receiving part receives light through the first substrate surface and has a photoelectric conversion function for received light and a charge accumulation function. The solid-state imaging device further includes a second-conductivity-type isolation layer that is formed on the side of the first-conductivity-type conductive layer of the light-receiving part, and a detection transistor that includes a second-conductivity-type electrode layer formed in the first-conductivity-type conductive layer near a second substrate surface of the substrate. The detection transistor detects an accumulated charge in the light-receiving part and has a threshold modulation function. The solid-state imaging device further includes a reset transistor that includes a first-conductivity-type electrode layer formed in the second-conductivity-type isolation layer that is adjacent to the formation area of the detection transistor along the direction parallel to the substrate surface. The reset transistor further includes the second-conductivity-type isolation layer between the first-conductivity-type electrode layer and the second-conductivity-type electrode layer of the detection transistor adjacent to the second-conductivity-type isolation layer. The reset transistor further includes the first-conductivity-type conductive layer of the light-receiving part. A first source region of a second conductivity type is formed in the first-conductivity-type conductive layer near the second substrate surface in each of cells isolated from each other, and a first drain region of the second conductivity type is formed to surround the first source region. The side of the first drain region remoter from the source side overlaps with a partial portion of the second-conductivity-type isolation layer along the direction parallel to the substrate surface. A first gate region surrounded by the first source region and the first drain region is formed. A second drain region as the first-conductivity-type electrode layer is formed in the second-conductivity-type isolation layer at a predetermined distance from the end of the first drain region remoter from the source side, and a second-conductivity-type region surrounded by the first drain region and the second drain region serves as a second gate region. An insulating film is selectively formed on the second substrate surface of the substrate in which the first source region, the first drain region, the first gate region, the second drain region, and the second gate region are formed. The detection transistor based on the first source region, the first gate region, and the first drain region and the reset transistor based on the second gate region, the second drain region, and the first-conductive-type conductive layer in the floating state as a source are formed across the second substrate surface.

According to a sixth embodiment of the present invention, there is provided a camera including a solid-state imaging device configured to receive light through a first substrate surface of a substrate, an optical system configured to guide incident light to the first substrate surface of the solid-state imaging device, and a signal processing circuit configured to process an output signal from the solid-state imaging device. The solid-state imaging device includes a light-receiving part that is formed in the substrate and includes a first-conductivity-type conductive layer. The light-receiving part receives light through the first substrate surface and has a photoelectric conversion function for received light and a charge accumulation function. The solid-state imaging device further includes a second-conductivity-type isolation layer that is formed on the side of the first-conductivity-type conductive layer of the light-receiving part, and an element area part that is formed in the light-receiving part near a second substrate surface of the substrate and processes an accumulated charge. The first-conductivity-type conductive layer of the light-receiving part is divided by a second-conductivity-type layer into two regions along the normal direction of the substrate, to thereby form a first region and a second region. A first-conductivity-type electrode layer is formed in the second-conductivity-type isolation layer that is adjacent to the first region along the direction parallel to the substrate surface. A transparent electrode to which bias voltage for developing a pinning function is applied is formed on the light-incident side of the first substrate surface. A memory transistor that includes the first-conductivity-type electrode layer, the second-conductivity-type isolation layer between the first region of the light-receiving part and the first-conductivity-type electrode layer, and the first region of the light-receiving part is formed.

BRIEF DESCRIPTION OF THE DRAWINGS

These and other objects and features of the present invention will become clearer from the following description of the preferred embodiments given with reference to the accompanying drawings, in which:

FIG. 5 is a diagram showing potential changes for electrons and holes in the semiconductor substrate in the respective regions along the direction perpendicular to the semiconductor substrate surface, in association with potential state changes in the device shown in FIG. 2;

FIG. 10 is a schematic sectional view showing the basic structure of a pixel part in a solid-state imaging device according to a second embodiment of the present invention;

FIG. 11 is a schematic sectional view showing the basic structure of a pixel part in a solid-state imaging device according to a third embodiment of the present invention;

FIGS. 12A to 12C are diagrams showing one pixel of FIG. 11: FIG. 12A is a diagram showing the sensor plane, FIG. 12B is a sectional view along line a-a' in FIG. 12A, and FIG. 12C is a diagram showing the transistor arrangement;

FIGS. 14A to 14C are explanatory diagrams of operation when the solid-state imaging device (image sensor) according to the third embodiment is applied to a global shutter;

DETAILED DESCRIPTION OF THE PREFERRED EMBODIMENTS

Embodiments of the present invention will be described below in association with the drawings.

First Embodiment

Figure 1:
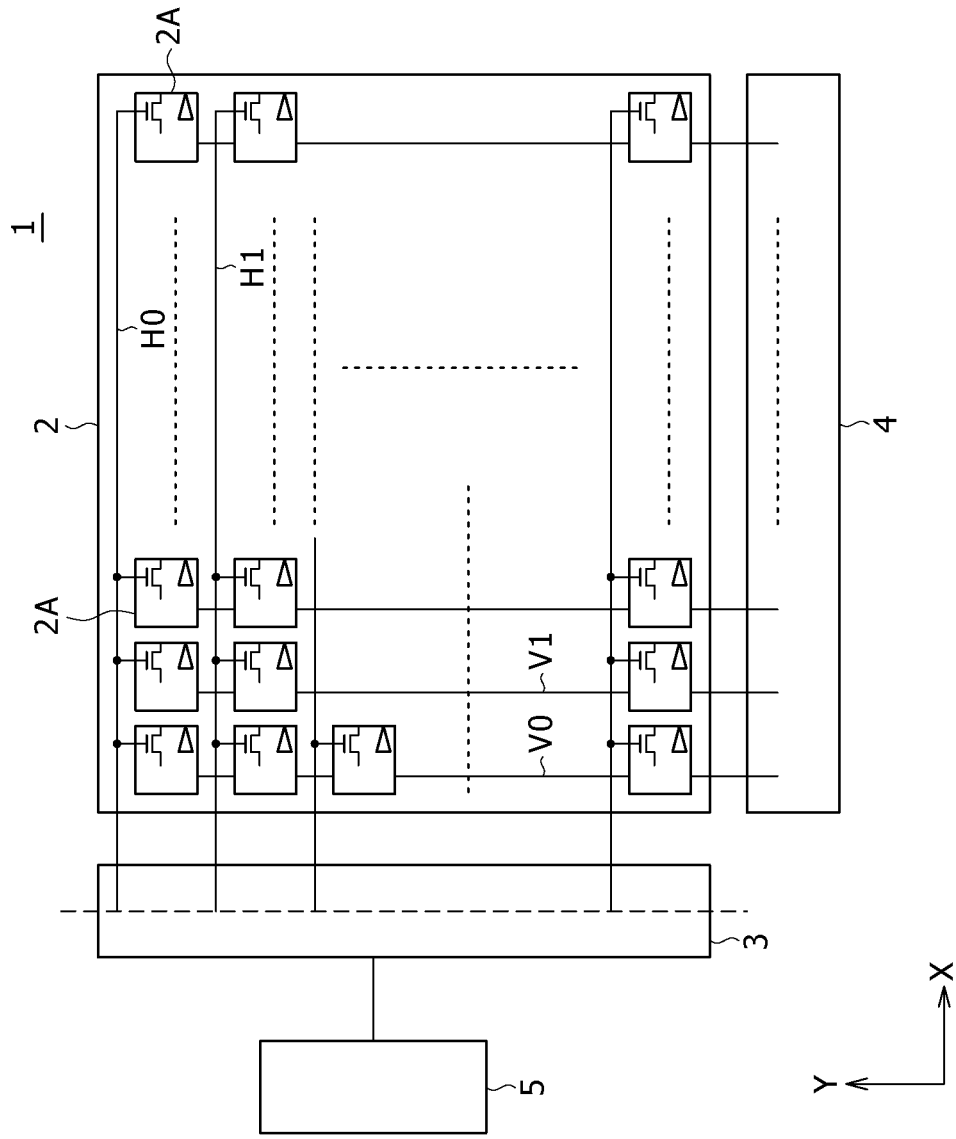
FIG. 1 is a schematic diagram showing the configuration of a solid-state imaging device according to an embodiment of the present invention.

FIG. 1 is a schematic diagram showing the configuration of a solid-state imaging device according to a first embodiment of the present invention.

A solid-state imaging device 1 shown in FIG. 1 includes a pixel part 2 as a sensing part, a column-direction (Y-direction) control circuit 3, a row-direction (X-direction) control circuit 4, and a timing control circuit 5.

The pixel part 2 is formed by arranging pixels 2A each including a light-receiving part, a reset transistor, and so on in a matrix (on rows and columns) as described in detail later.

The pixel part 2 of the present embodiment is formed as a back-irradiation lateral-overflow image sensor based on a charge modulation system. Each pixel 2A in the present embodiment has a floating cell structure.

In the pixel part 2, the pixels arranged on the same column are connected to a common column line H0, H1, ..., and the pixels arranged on the same row are connected to a common row line V0, V1, ....

Furthermore, in the solid-state imaging device 1, the timing control circuit 5 that produces an internal clock is disposed as a control circuit for sequentially reading out signals of the pixel part 2.

In addition, the column-direction (Y-direction) control circuit 3 that controls column addresses and column scanning, and the row-direction (X-direction) control circuit 4 that controls row addresses and row scanning are disposed.

Upon receiving a timing control pulse from the timing control circuit 5, the column-direction (Y-direction) control circuit 3 drives the predetermined column line H0, H1, ....

Upon receiving a timing control pulse from the timing control circuit 5, the row-direction (X-direction) control circuit 4 executes predetermined processing (e.g., correlated double sampling (CDS) processing and analog-digital conversion processing) for a signal read out to the predetermined row line V0, V1, ....

The specific device structure of the pixel part in the solid-state imaging device according to the present embodiment will be described below.

Figure 2:
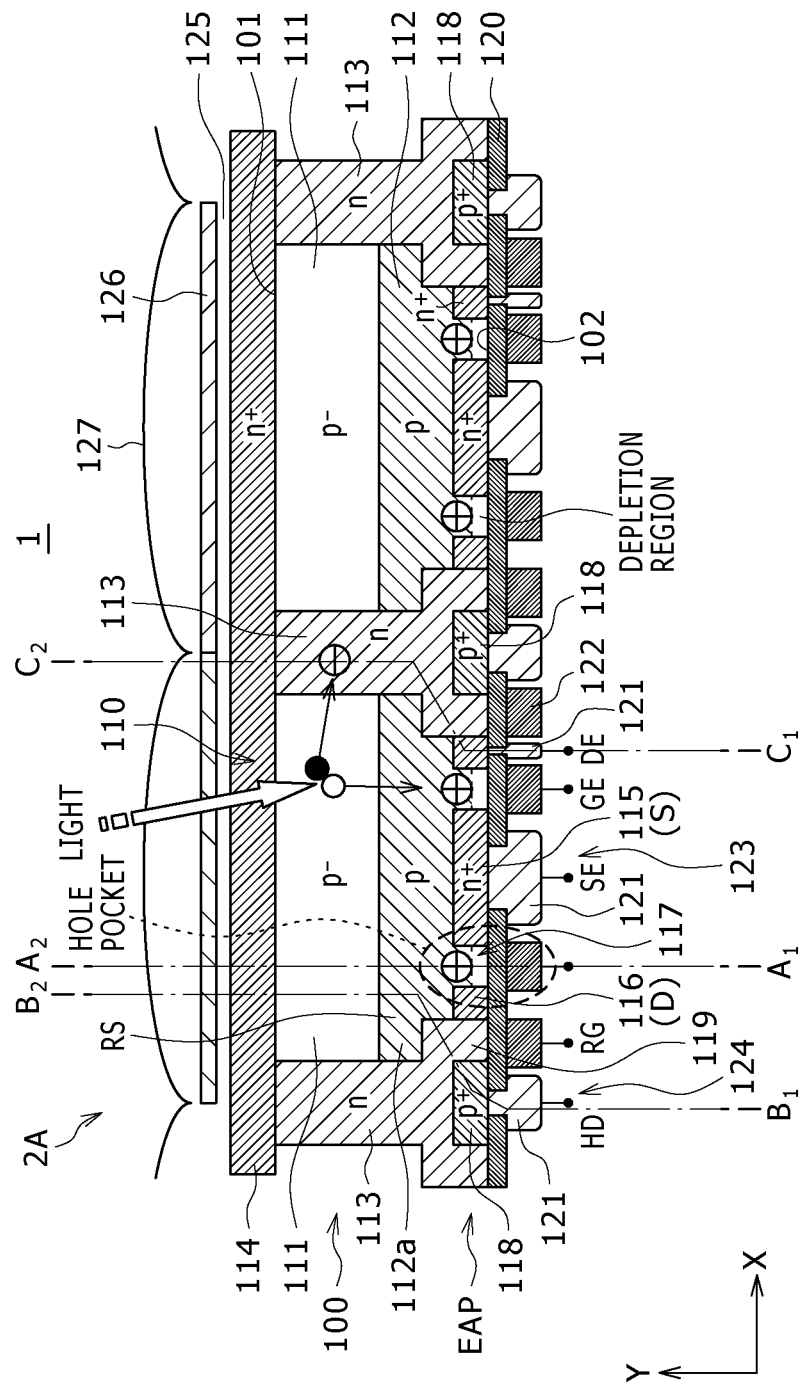
FIG. 2 is a schematic sectional view showing the basic structure of a pixel part in a solid-state imaging device according to a first embodiment of the present invention.

FIG. 2 is a schematic sectional view showing the basic structure of the pixel part in the solid-state imaging device according to the first embodiment. Two pixel parts are shown in FIG. 2.

The solid-state imaging device 1 is formed as a back-irradiation device as shown in FIG. 2. Specifically, for the device, light is incident on a first substrate surface 101 (backside) of a substrate (silicon substrate) 100 of a first conductivity type (p-type, in the present embodiment). Furthermore, an element area part EAP including a MOS transistor and so on is formed near a second substrate surface 102 (front side).

The substrate 100 is formed by thinning a silicon wafer so that light incidence from the backside may be permitted. The thickness of the substrate 100 is e.g. in the range of 2 to 6 μm for visible light and e.g. in the range of 6 to 10 μm for near-infrared light, although depending on the kind of the solid-state imaging device 1.

For the pixel 2A, a light-receiving part 110 is formed across a region in the substrate 100 from the first substrate surface 101 to the transistor formation area near the second substrate surface 102. The light-receiving part 110 has functions to receive light incident on the first substrate surface and subject the received light to photoelectric conversion, and to accumulate a charge.

More specifically, in the light-receiving part 110, a p⁻-type region (conductive layer) 111 in which photoelectric conversion is carried out and a p-type region (conductive layer) 112 in which holes are accumulated are formed. On the sidewalls of the p⁻-type conductive layer 111 and the p-type conductive layer 112, an isolation layer (conductive layer) 113 of the n-type as a second conductivity type opposite to the first conductivity type (p-type, in the present embodiment) is formed to surround these conductive layers 111 and 112.

Furthermore, an n⁺ layer 114 is formed on the first substrate surface 101, which is the light-incident surface of the substrate 100. The n-type isolation layer 113 is provided with no electrode.

In this manner, in each pixel 2A, the p⁻-type conductive layer 111 and the p-type conductive layer 112 are surrounded by the n-type isolation layer 113 so as to be in the floating state, and therefore each pixel 2A has a floating cell structure as a cell. Furthermore, each pixel 2A has a micro shielded structure electrically due to the n-type isolation layer 113, the n⁺ layer 114, the gate metal electrode, and so forth.

In this manner, in the present embodiment, a cell structure is formed by isolating the p⁻-type conductive layer (region) 111 and the p-type conductive layer (region) 112 by the n-type isolation layer 113. Furthermore, in each of the cells isolated from each other, a first source region 115 formed of an n⁺ layer is formed in the p-type conductive layer 112 near the second substrate surface 102.

In addition, a first drain region 116 formed of an n⁺ layer is formed to surround the first source region 115.

The first drain region 116 is so formed that the side thereof remoter from the source overlaps with a partial portion of the n-type isolation layer 113 along the direction parallel to the major surface of the substrate 100. A first gate region 117 surrounded by the first source region 115 and the first drain region 116 is formed.

Furthermore, in the n-type isolation layer 113, a second drain region 118 formed of a p⁺ layer is formed at a predetermined distance from the end of the first drain region 116 remoter from the source.

The n-type region surrounded by the first drain region 116 and the second drain region 118 serves as a second gate region 119.

Furthermore, an insulating film 120 composed of e.g. silicon oxide is selectively formed by a predetermined process on the second substrate surface 102 of the substrate 100, under which the first source region 115, the first drain region 116, the first gate region 117, the second drain region 118, and the second gate region 119 are formed.

As described above, the p⁻-type conductive layer 111 and the p-type conductive layer 112 are provided with no electrode, so that the light-receiving part 110 is in the electrically-floating state. Apertures in the insulating film 120 are provided on the first source region 115, the first drain region 116, and the p⁺ second drain region 118 formed in the n-type isolation layer 113, and electrode portions 121 are formed on the apertures.

Furthermore, gate electrodes 122 are formed on the partial portions of the insulating film 120 over the first gate region 117 interposed between the first source region 115 and the first drain region 116, and the n-type second gate region 119 interposed between the n⁺ and p⁺ regions for an overflow structure.

In this structure, across the second substrate surface 102, a detection transistor 123 formed of a first gate-insulated field effect transistor (referred to as a MOS transistor (MOSTr)) based on the first source region 115, the first gate region 117, and the first drain region 116 is formed. In addition, a reset transistor 124 formed of a second MOS transistor based on the second gate region 119, the second drain region 118, and the p-type conductive layer (region) 112a in the floating region as the source is formed.

In FIG. 2, symbol S denotes the source of the detection transistor 123. D denotes the drain of the detection transistor 123. SE denotes the source electrode of the detection transistor 123. GE denotes the gate electrode of the detection transistor 123. DE denotes the drain electrode of the detection transistor 123. RG denotes the gate electrode of the reset transistor 124. RS denotes the source (floating p-type region) of the reset transistor 124. RD denotes the drain (p⁺ second drain region) of the reset transistor 124. HD denotes the hole drain electrode of the reset transistor 124.

A hole pocket is formed in a potential well of the gate region between the source and drain of the detection transistor 123, and holes are accumulated in the hole pocket.

Furthermore, the second drain region 118 of the reset transistor 124, which is adjacent to the first drain region 116 of the detection transistor 123 and employs the n-type region on the same surface as its second gate region 119, is formed, and thus a lateral overflow drain structure is realized.

On the light-incident surface of the n⁺ layer 114, an insulating film composed of e.g. silicon oxide and a protective film 125 are formed. On the protective film 125, a color filter 126 that allows the passage of only light in a desired wavelength range is formed. On the color filter 126, microlenses 127 for condensing incident light on the light-receiving part 110 are formed.

In the present embodiment, as described above, the p⁻-type conductive layer 111 in the light-receiving part 110 is entrusted mainly with a function of generating pairs of electron and hole through photoelectric conversion. The n-type isolation layer 113 is entrusted with a function of discharging generated electrons from the drain electrode to the external via the n⁺ first drain region 116 near the surface. The p-type conductive layer 112 is entrusted with a function of accumulating generated holes.

The impurity concentration of the p⁻-type conductive layer 111 in the floating cell structure is so set lower than that of the p-type conductive layer 112 that efficient generation of photo-carriers is permitted. Furthermore, the light-irradiation side is doped with an impurity of the conductivity type opposite to that of the floating layer at high concentration (n⁺).

In the present embodiment, the first gate region 117 surrounded by the first source region 115 and the first drain region 116 is formed into a ring shape.

Specifically, the first gate region 117 having a ring shape is formed near the surface of the semiconductor layer of the p-type conductive layer 112 in the floating region. The first source region 115 is formed at the center of the ring, and the first drain region 116 is so formed outside the first gate region 117 having the ring shape as to surround the first gate region 117 and the first source region 115. Electrodes are formed over the respective regions, so that the detection transistor 123 is formed.

Moreover, adjacent to the detection transistor 123, an n-type semiconductor well is so formed as to partially overlap with the drain region. In addition, in order that a gate region is formed in this well, a heavily-doped region (p⁺) of the conductivity type opposite to that of the well is formed as the second drain region 118 at a predetermined distance from the drain region of the detection transistor 123. Furthermore, the reset transistor 124 employing a partial portion of the substrate region of the detection transistor 123 (p layer) as its source region is formed.

In the present embodiment, the partial portion of the semiconductor region employed by the detection transistor 123 and the reset transistor 124 is used also as the photodiode region. Specifically, in the present embodiment, the $p^+/n/p/p^-/n/n^+$ region (the $p^+$ and $n^+$ regions are provided with electrodes) is used to form a pnpn-type diode.

In the solid-state imaging device 1, even when negative voltage is not applied to the gate of the detection transistor 123 (first MOS transistor) formed across the second substrate surface 102, a hole pocket in which holes arising from the photoelectric effect are accumulated selectively and preferentially exists in a potential well, due to potential formed in the vicinity of the surface of the ring-shape semiconductor under the gate insulating film.

Depending on the charge amount of the holes accumulated in the hole pocket, the channel electron current between the first source and first drain of the detection transistor 123 is modulated, which makes it possible to amplifier and detect the signal arising from the light irradiation. Thus, the processes of generation of photo-carriers due to the photoelectric effect, transferring of the photo-carriers, hole accumulation, and signal detection are continuously carried out in short time, so that dynamic signal processing is realized.

Furthermore, in the present embodiment, plural (two or more) reset transistors 124 are disposed around the detection transistor 123, and voltage of predetermined polarity is applied to the gates and drains of the respective reset transistors 124, to thereby cause holes accumulated in the p-type well and hole pocket to be discharged (overflow) toward the respective second drains laterally to the direction of the semiconductor substrate surface. This feature aims to enhance the discharge efficiency.

The operation of the pixel cell having the above-described structure will be described below.

Light is caused to enter the cell through the first substrate surface 101 on the backside, so that pairs of electron and hole are generated in the p--type conductive layer 111 in the cell due mainly to the photoelectric effect. The generated electrons are discharged to the external via the n-type isolation layer 113, which serves as the sidewall of the cell.

Thus, only the holes are stored in the p-type conductive layer 112 and accumulated in a potential well (hole pocket) formed in the vicinity of the semiconductor surface of the gate region between the source and drain of the detection transistor 123 as the first MOS transistor. By the detection transistor 123, the signal of the accumulated charge is amplified and detected. The accumulated charge is appropriately discharged via the reset transistor 124 as the second MOS transistor, which allows control of crosstalk and the saturated charge amount.

More specifically, of the electrons and holes generated due to the photoelectric effect in the p$^-$-type conductive layer 111 in the cell through backside irradiation, the electrons are discharged to the first drain region 116 via the n-type isolation layer 113 if ground potential or positive potential is applied to the drain electrode.

In contrast, if negative voltage is applied to the gate electrode of the first MOS transistor (detection transistor) 123, the holes are attracted toward the semiconductor surface under the gate electrode between the source and drain of the detection transistor 123 as the first MOS transistor, so as to be accumulated in a potential well formed in the vicinity of the semiconductor surface, i.e., in the hole pocket.

These accumulated holes cause the electron current flowing through the channel between the source and drain to be modulated toward larger current, and therefore the threshold voltage is decreased.

That is, the increase of the accumulated holes decreases the channel threshold voltage, while the decrease of the accumulated holes increases the channel threshold voltage.

Consequently, the first MOS transistor (detection transistor) 123 can be used as a transistor for amplifying and detecting a signal arising from light irradiation.

The p$^-$-type conductive layer (region) 111 and the p-type conductive layer (region) 112 in each pixel 2A have an electrically-shielded structure due to the n-type isolation layer 113 on the side surface, the n$^+$ layer 114 on the backside, the n$^+$ layers serving as the source and drain on the front side, the gate metal electrode, and so forth. Thus, the electron current arising from the photoelectric effect flows through the n-type isolation layer 113 on the side surface. This provides an effect like the Faraday cage effect, which prevents the external electrostatic discharge (ESD) from entering the cell and thus hardly causes variation in the charge amount of the internal accumulated holes.

In order to always obtain new optical information, reset operation of discharging the charge accumulated in the detection transistor 123 to thereby evacuate the accumulation well every constant time should be carried out. This reset operation is carried out by the reset transistor 124 as the second MOS transistor.

When negative voltage is applied to the hole drain electrode HD and reset gate electrode RG of the reset transistor 124, the hole charge accumulated in the hole pocket overflows the drain region of the detection transistor 123 so as to flow into the channel region formed in the reset transistor 124, followed by being discharged from the hole drain electrode HD to the external via the second drain region 118 of the reset transistor.

The thickness of the semiconductor layer of the sensor in the solid-state imaging device 1 is at most about 2 μm. This thickness allows sufficient exertion of the quantum efficiency of photoelectric conversion in the wavelength range of light.

On the other hand, in the case of a front-irradiation device, the semiconductor substrate needs to have a thickness that hardly causes element cracking (about several hundreds of micrometers) in general. Therefore, leakage current between the source and drain through the element substrate is not ignorable, which often leads to a problem.

In contrast, in the present embodiment, because the element thickness is sufficiently decreased, the leakage current through the substrate can be reduced, and thus this problem is also avoided.

This is the end of the description of the structure and functions of the solid-state imaging device 1 according to the present embodiment.

A further detailed discussion on the solid-state imaging device 1 according to the present embodiment will be made below.

Figure 3A:
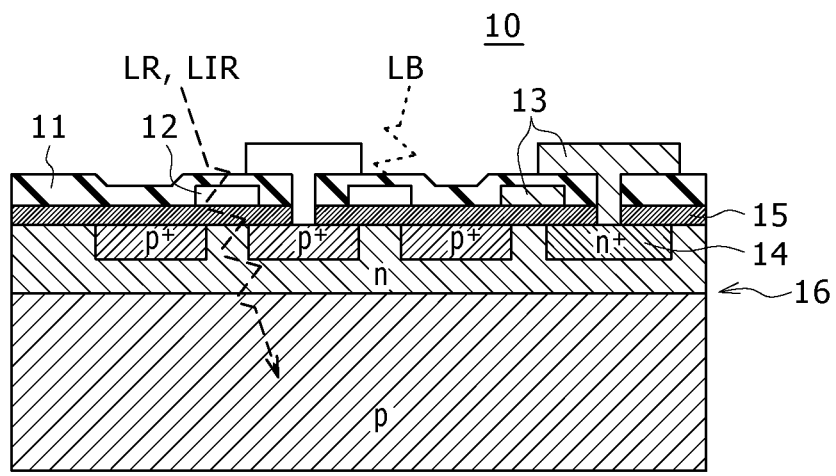
FIGS. 3A and 3B show the relationship between the wavelengths of incident light beams and the transistor arrangement, regarding a front-irradiation BMCD and a back-irradiation BMCD according to the embodiment of the present invention.
Figure 3B:
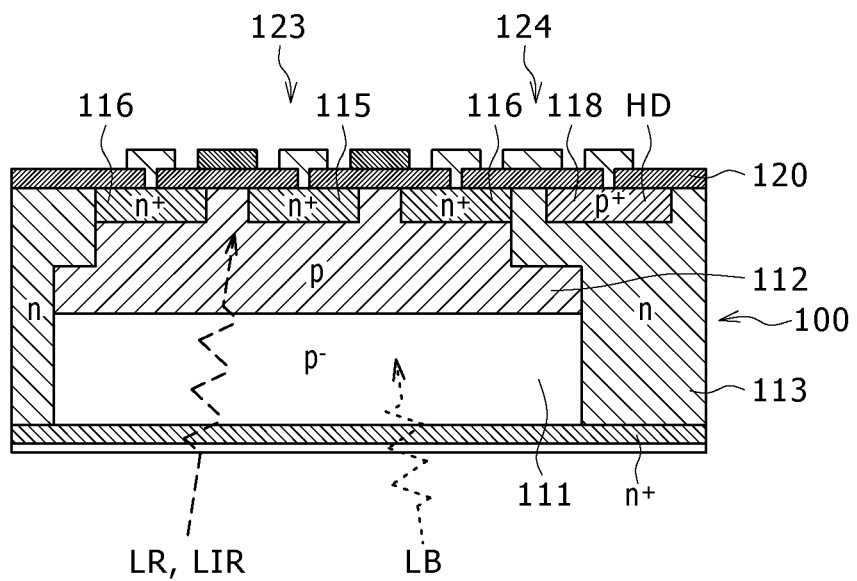

FIGS. 3A and 3B show the relationship between the wavelengths of incident light beams and the transistor arrangement, regarding a front-irradiation BMCD and the back-irradiation BMCD according to an embodiment of the present invention.

In a front-irradiation BMCD 10 of FIG. 3A, an insulating film 11, a transparent electrode 12, a light-shielding electrode 13, and so on are formed on the front side of the substrate. Furthermore, reference numeral 14 denotes a lateral drain, 15 denotes a gate insulating film, and 16 denotes a silicon substrate.

In the case of the front-irradiation device of FIG. 3A, light enters the device from the transistor side. Because the lateral drain region 14 is covered by the light-shielding electrode 13, the light enters the silicon substrate 16 by passing through the insulating film 11, the transparent electrode 12, the gate insulating film 15, and so on via apertures other than that over the lateral drain region 14. Red light LR and near-infrared light LIR having a long wavelength reach a comparatively-deep area through the silicon substrate. However, blue light LB and near-ultraviolet light are subjected to photoelectric conversion at an area that is not so deep. Furthermore, light with a short wavelength is susceptible to energy loss in the passage of the insulating multilayer film on the surface, due to e.g. scattering, absorption, and reflection by the interface between layers.

In contrast, for the back-irradiation device of FIG. 3B according to the embodiment, light enters the substrate (silicon substrate) 100 through the surface across which the detection transistor 123 for signal detection is not disposed. Due to this structure, large part of light having a long wavelength reaches the vicinity of the transistor, but only small part of light having a short wavelength reaches the vicinity of the transistor.

Various proposals have been made about how the diffusion layers and well layers of the source and drain should be designed, in order to provide an improvement relating to the wavelengths of incident light beams and maximize the quantum efficiency.

However, few discussions have been made on the possibility that the light that has passed through a silicon oxide film (insulating film) affects transistor characteristics. The following description relating to the present embodiment will deal with this point and bring out the mechanism to some extent, although qualitatively.

Figure 4:
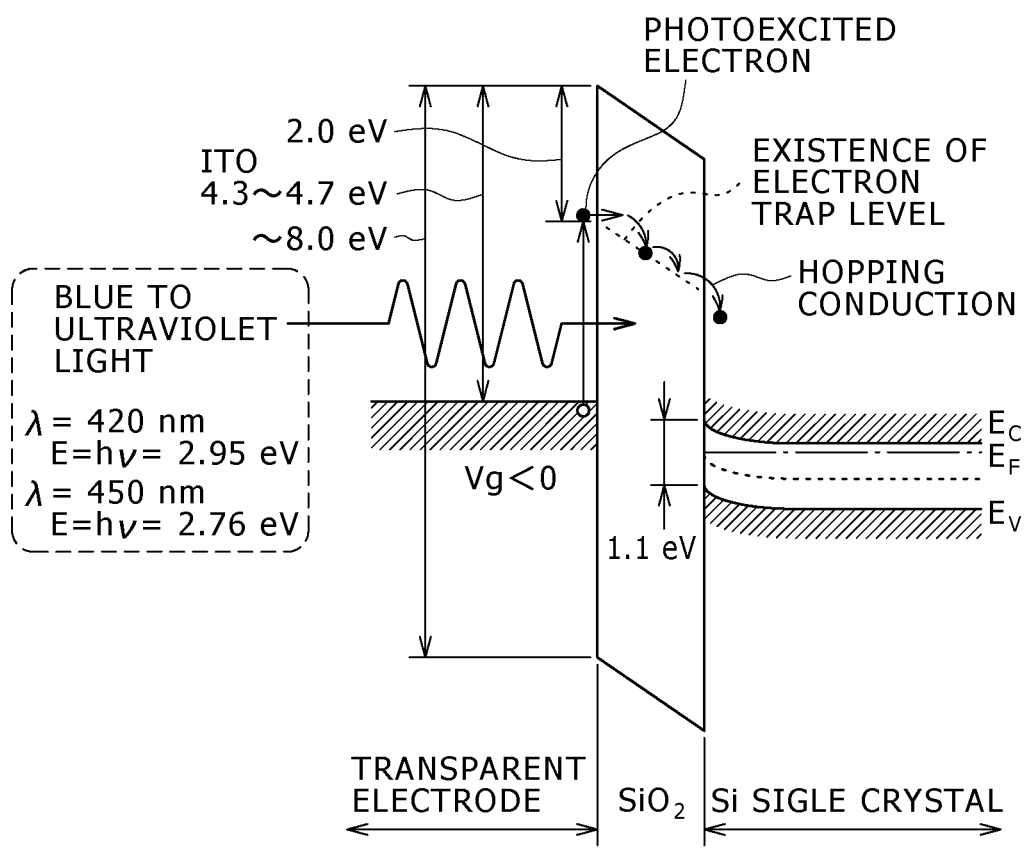
FIG. 4 is a diagram schematically showing the energy band state of a structure formed of transparent electrode/gate silicon oxide film/silicon single crystal in a front-irradiation device.

FIG. 4 is a diagram schematically showing the energy band state of a structure formed of transparent electrode/gate silicon oxide film/silicon single crystal in a front-irradiation device.

The characteristics of the gate oxide film often greatly differ depending on the manufacturing method and treatment therefor. Unless the manufacturing thereof is sufficiently controlled, traps that capture electrons and holes remain in the oxide film. FIG. 4 shows the case in which a trap that captures an electron exists at the position whose level is lower by 2.0 eV than the conduction band of the silicon oxide film.

In the case of a silicon thermal-oxide film, the band gap thereof is about 8.0 eV. Therefore, if ITO is used as the transparent electrode, the Fermi level of the transparent electrode exists at a position slightly lower than the center of the energy gap of the thermal oxide film because the work function of ITO is in the range of about 4.3 to 4.7 eV.

In the case of a blue light component of incident light with a wavelength λ of e.g. 450 nm, the energy E thereof is equal to 2.76 eV according to the Einstein's light quantum theory E=hν. As shown in the diagram, this energy is almost equivalent to the position of the energy level of an electron trap in the oxide film with respect to the Fermi level of the transparent electrode.

When comparatively-high negative voltage is applied to the transparent gate electrode with respect to the silicon substrate, an electron knocked out from the metal surface (transparent electrode) due to the photoelectric effect is excited into the oxide film and captured by a trap.

The electron captured by the trap is discharged again by an electric field and flows into the conduction band of the silicon single crystal through hopping conduction. This causes weak conduction between the gate electrode and the silicon, which yields variation in the transistor characteristics and the signal amount.

In the back-irradiation device of the present embodiment, high-energy light with a short wavelength consumes almost all of its energy for photo-carrier generation in the silicon substrate by the time the light reaches the transistor region. Therefore, the present embodiment is free from the problems involved by the front-irradiation devices, which is a great feature of the present embodiment.

FIG. 5 is a diagram showing potential changes for electrons and holes in the semiconductor substrate in the respective regions along the direction perpendicular to the semiconductor substrate surface, in association with potential state changes in the device shown in FIG. 2.

(i) Hole Accumulation (Non-Reading-Out State)

The uppermost diagram shows the case in which the detection transistor (first MOS transistor) 123 is set to the source-follower state and voltage of −2 V is applied to the drain and gate. In the semiconductor region indicated by the chain line $A_1$-$A_2$ under the gate electrode, the potential indicated by the bold full curve <1> is formed.

In this case, because the resistance of the p⁻-type region (conductive layer) 111 is higher than that of the p-type region (conductive layer) 112, the electric field is applied to the p⁻-type region to more extent, and thus the potential curve greatly bends on the right side of the diagram. Because negative voltage is applied to the gate electrode, holes arising from the light irradiation are attracted toward the semiconductor surface in the gate region.

In the case of a gate oxide film formed through a general thermal oxidation process, a slight part of the p-type semiconductor surface is turned to the n-type. Thus, even when voltage is not applied to the gate, this part is in the depletion state and therefore a channel region is formed. If negative voltage is applied to the gate in this state, holes are attracted toward the surface and accumulated outside the electron channel formed under the gate region between the source and drain.

The long dashed line $B_1$-$B_2$ <2> indicates the potential state formed through the hole drain electrode HD, the p⁺ second drain region 118, the buried n-type conductive layer (region) 113, the p-type region 112a for hole accumulation (equivalent to the source of the reset transistor 124), and the p⁻-type region 111 for carrier generation. The short dashed line $C_1$-$C_2$ <3> indicates the potential formed through the n⁺ first drain region 116 serving as the drain of the detection transistor 123, the buried n-type second gate region 119, the n-type isolation layer 113, and the backside n⁺ layer 114.

(ii) Gate Reading-Out

If the gate voltage of the detection transistor 123 is changed from −2 V to 0 V, the accumulated holes are reduced and the channel electron current flowing from the source to the drain is correspondingly modulated so as to be decreased. Measurement of the current change amount allows finding of the charge change amount of the accumulated holes.

(iii) Reset

When bias is applied between the source and drain of the reset transistor 124 and negative voltage is applied to the hole drain electrode HD and the reset gate electrode RG, holes existing in the p-type conductive layer (region) 112 and the hole pocket are discharged from the hole drain electrode HD via the p-channel formed in the reset transistor 124.

Figure 6:
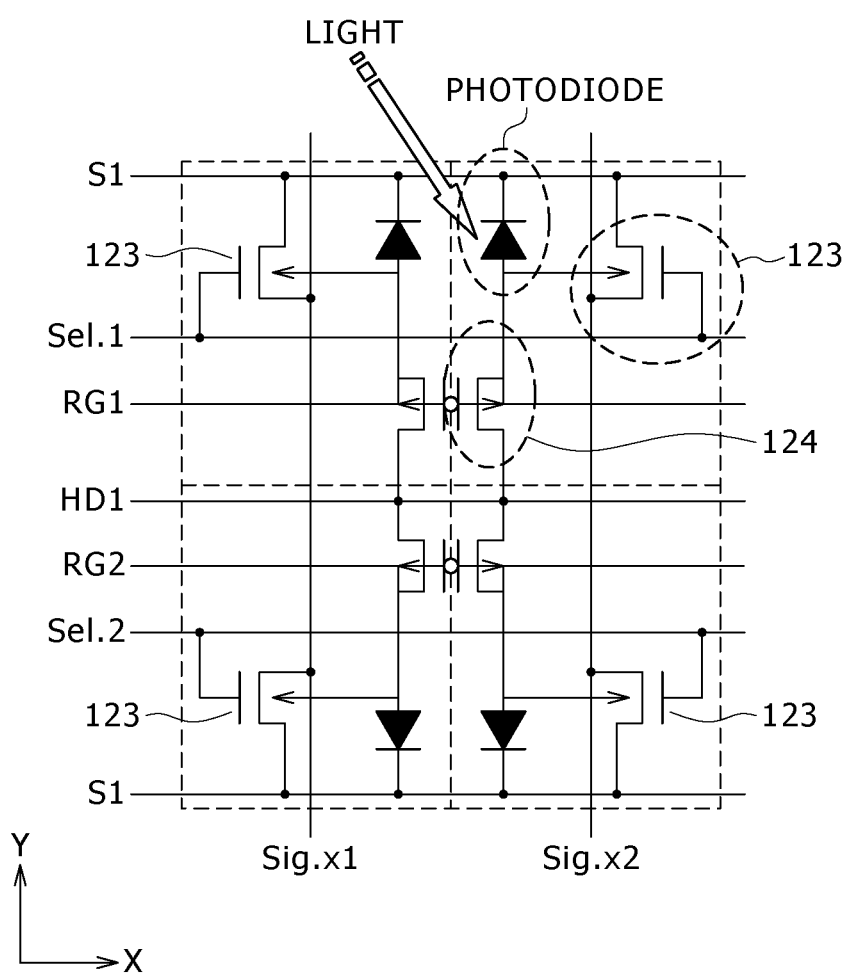
FIG. 6 is a diagram showing a circuit arrangement example of the device of FIG. 2.

FIG. 6 is a diagram showing a circuit arrangement example of the device of FIG. 2.

FIG. 6 shows four pixels in the arrangement example in which two pixels along the horizontal direction (X direction)

(every two column along the Y direction of the orthogonal coordinate system in FIG. 6) and two pixels along the vertical direction (Y direction) (every two rows along the X direction) are disposed based on current mirror arrangement. Such arrangement can halve the number of interconnects for both the interconnects along the X direction and the Y direction.

A drain signal S1 is supplied to the drains of the detection transistors 123. A gate signal Sel.1, Sel.2, ... is supplied to the gates on a column-by-column basis, and a signal Sigx.1, Sigx.2, ... is output from the source on a row-by-row basis.

Furthermore, a reset gate signal RG1, RG2, ... is supplied to the gates of the reset transistors 124 on a column by column basis, and a hole drain signal HD1 is supplied to the drains of plural (four, in the case of FIG. 6) reset transistors in common.

Figure 7:
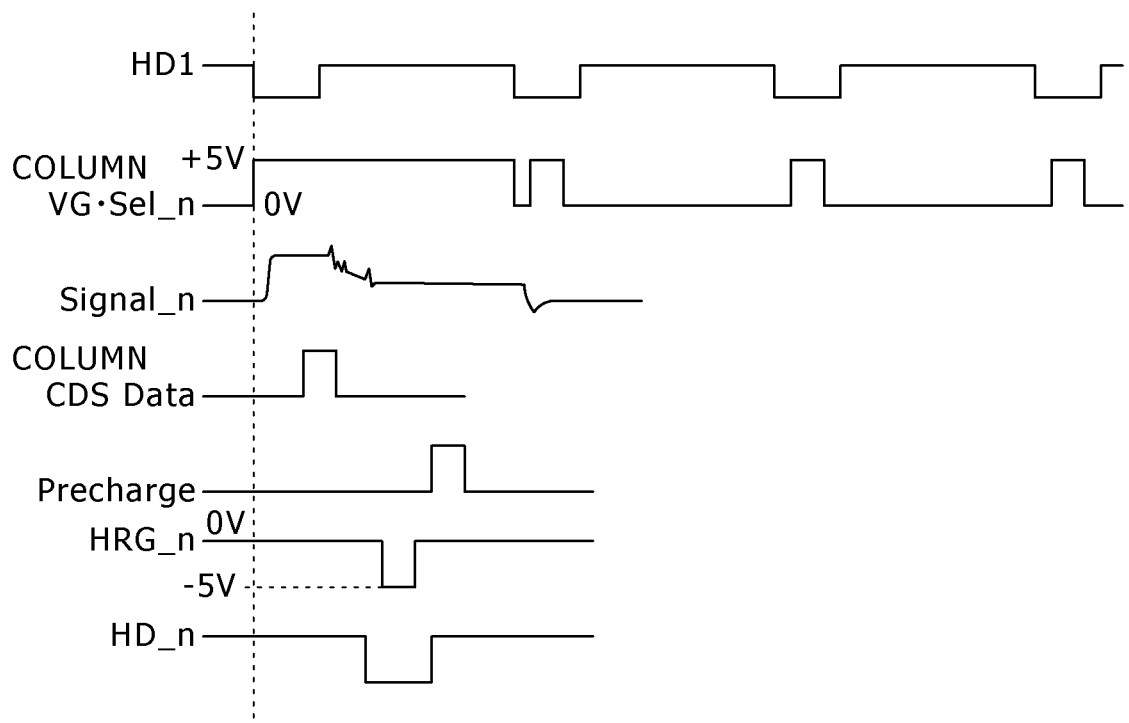
FIG. 7 is a timing chart showing driving of a solid-state imaging device (image sensor) employing the circuit of FIG. 6.

FIG. 7 is a timing chart showing driving of a solid-state imaging device (image sensor) employing the circuit of FIG. 6.

In the embodiment of the present invention, in order to facilitate formation of a hole pocket, precharge operation of injecting electrons into the channel layer of the detection transistor 123 after reset is carried out.

Figure 8:
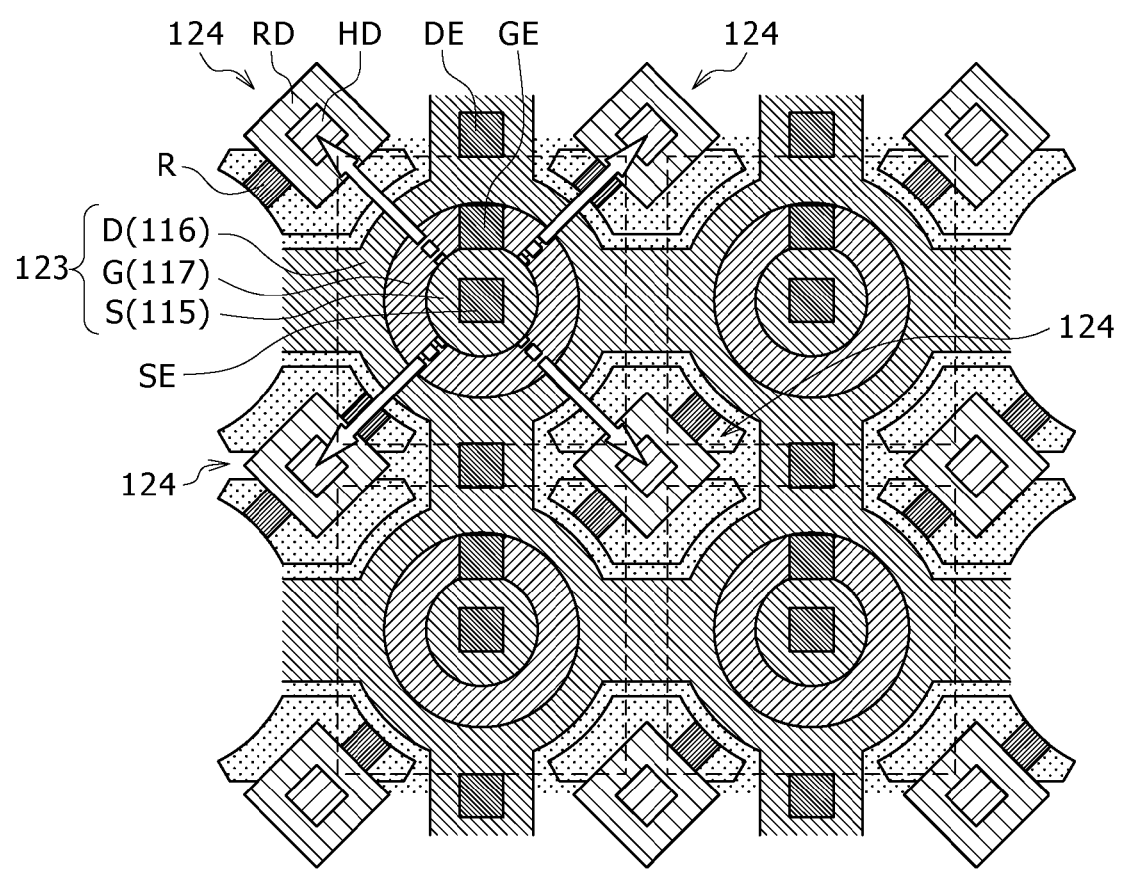
FIG. 8 is a diagram showing a first arrangement example of the transistors of FIG. 2.

FIG. 8 is a diagram showing a first arrangement example of the transistors of FIG. 2.

In this example, the reset transistors (second MOS transistors) 124 are disposed at four corners of the pixel, around the first source region 115 of the detection transistor (first MOS transistor) 123 having the ring-shape first gate region 117. This structure allows accumulated holes to be rapidly drained toward four directions at the time of reset.

Figure 9:
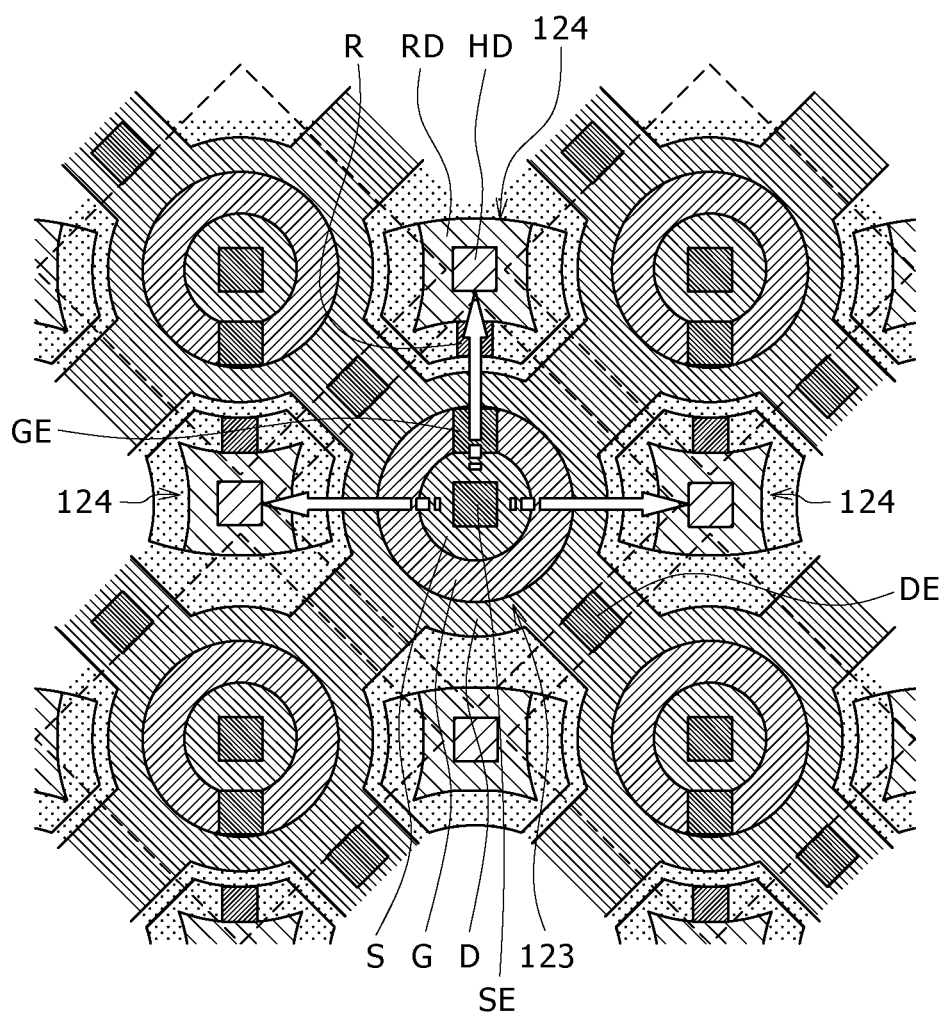
FIG. 9 is a diagram showing a second arrangement example of the transistors of FIG. 2.

FIG. 9 is a diagram showing a second arrangement example of the transistors of FIG. 2.

The structure of FIG. 9 arises from rotation of the arrangement of FIG. 8 by 45 degrees. Due to this structure, the area of one pixel in FIG. 9 is set larger than that in FIG. 8, so that definition enhancement is realized.

This structure allows accumulated holes to be rapidly drained toward three directions at the time of reset.

As described above, according to the first embodiment, a cell structure is formed by isolating the $p^-$-type conductive layer (region) 111 and the p-type conductive layer (region) 112 by the n-type isolation layer 113. In each of the cells isolated from each other, the first source region 115 formed of an $n^+$ layer is formed in the p-type conductive layer (region) 112 near the second substrate surface 102. The first drain region 116 formed of an $n^+$ layer is formed to surround the first source region 115. The first drain region 116 is so formed that the side thereof remoter from the source overlaps with a partial portion of the n-type isolation layer 113 along the direction parallel to the surface of the substrate 100. The first gate region 117 surrounded by the first source region 115 and the first drain region 116 is formed. In the n-type isolation layer 113, the second drain region 118 formed of a $p^+$ layer is formed at a predetermined distance from the end of the first drain region 116 remoter from the source. The n-type region surrounded by the first drain region 116 and the second drain region 118 serves as the second gate region 119. The insulating film 120 composed of e.g. silicon oxide is selectively formed by a predetermined process on the second substrate surface 102 of the substrate 100, under which the first source region 115, the first drain region 116, the first gate region 117, the second drain region 118, and the second gate region 119 are formed. Across the second substrate surface 102, the detection transistor 123 based on the first source region 115, the first gate region 117, and the first drain region 116, and the reset transistor 124 based on the second gate region 119, the second drain region 118, and the p-type conductive layer (region) 112a in the floating region as its source are formed. The first embodiment having this configuration can provide the following advantages.

Due to the backside irradiation and lateral overflow structure, a high-speed and high-sensitivity image sensor can be realized in which optical loss due to light absorption/reflection by interconnects and a multilayer surface layer of insulating layers is small unlike front-irradiation devices and variation in the signal amount is not caused even when light having a short wavelength is incident thereon.

The lateral overflow drain (OFD) structure can lower the reset voltage.

Due to the feature that the reset transistors are disposed in the gaps among the ring gates, efficient transistor arrangement is realized and cell miniaturization is permitted.

Because of the backside irradiation, the signal detection plane is away from the light-irradiation surface and the hole accumulation part does not need to be covered by a light-shielding film. This leads to a reduced number of steps of the element manufacturing.

Transferring of photo-carriers to the accumulation part can be easily carried out merely by changing the potential state in the cell, without a particular need to provide a transfer transistor. Therefore, the device of the embodiment is suitable for high-speed driving.

Furthermore, in the structure of FIG. 2, the electrode lead-out surface may be only one surface and can be disposed on the opposite side to the light-irradiation surface.

Because of a so-called cell-type bulk structure, more charge can be accumulated with small pixel area, and the saturated signal amount can be increased. In addition, because of the shielded structure, the device of the embodiment is robust against electrostatic discharge.

Modulation control of the saturated charge amount can be carried out.

FIG. 10 is a schematic sectional view showing the basic structure of the pixel part in a solid-state imaging device according to a second embodiment of the present invention. Two pixel parts are shown also in FIG. 10.

A solid-state imaging device 1A according to the second embodiment is different from the solid-state imaging device 1 (FIG. 2) according to the first embodiment, in that a transparent electrode 129 composed of e.g. ITO is disposed with the intermediary of an insulating film 128 formed of e.g. an oxide film, instead of the $n^+$ layer 114 on the first substrate surface 101 of the substrate 100.

If positive voltage is applied to the transparent electrode 129 at the time of light irradiation, electrons are attracted toward the substrate surface and can be temporarily pinned during the application of the positive voltage. Thus, the solid-state imaging device 1A can function also as a memory.

FIG. 11 is a schematic sectional view showing the basic structure of the pixel part in a solid-state imaging device according to a third embodiment of the present invention. Two pixel parts are shown also in FIG. 11.

A solid-state imaging device 1B according to the third embodiment is different from the solid-state imaging device 1 (FIG. 2) according to the first embodiment, in that the solid-state imaging device 1B has a memory function and thus allows implementation of an electronic shutter function unlike the method including dynamic signal processing.

That is, this solid-state imaging device 1B is formed as a backside-detection charge modulation memory image sensor (back sensing & charge modulation memory (B.S.C.M)).

In the solid-state imaging device 1B, $p^-$-type regions are stacked as shown in FIG. 11. Specifically, a $p^-$-type region is divided by an n layer 130 into two $p^-$-type regions (conductive layers) 111-1 and 111-2 vertically arranged along the normal direction of the substrate.

A third drain region 131 formed of a p⁺ layer is formed, adjacent to the first substrate surface 101, in an n-type isolation layer 113-1 formed on the sidewall of the first p⁻-type region 111-1 on the light-reception side (near the first substrate surface 101). Furthermore, on the surface side (light-irradiation side) of the first substrate surface 101, a back gate (MG) 133 formed of a transparent electrode composed of e.g. ITO is formed with the intermediary of an insulating film 132 formed of e.g. an oxide film. The partial area over the third drain region 131 is opened and a drain electrode (MD) 134 is formed on the opening.

Thus, a third MOS transistor (memory (pinning) transistor) 135 based on the back gate 133, the third drain region 131, and the first p⁻-type region 111-1 in the floating region as its source is formed.

In the solid-state imaging device 1B according to the third embodiment, a first region 201 surrounded by the dashed line on the light-reception side (including the first substrate surface 101), including the first p⁻-type region 111-1, is entrusted with a sensing & memory function. A second region 202 surrounded by the center dashed line, including the p⁻-type region (second p⁻-type region) 111-2, is entrusted with a detection and transfer function. A third region 203 surrounded by the dashed line including the second substrate surface 102 is entrusted with a modulation and output line function. EAP denotes the element area part.

The structure except for the first region 201, i.e., the structure of the second region 202 and the third region 203, is the same as that in FIG. 2, and the description of this same part is omitted.

In this device, if negative voltage is applied to the back gate (MG) 133 formed of a transparent electrode at the time of light irradiation, photo-holes are attracted toward the substrate surface and can be temporarily pinned during the application of the negative voltage to the back gate (MG) 133.

FIGS. 12A to 12C are diagrams showing one pixel of FIG. 11. FIG. 12A is a diagram showing the sensor plane. FIG. 12B is a sectional view along line a-a' in FIG. 12A. FIG. 12C is a diagram showing the transistor arrangement.

FIG. 12A is a plan view of the sensor side. The p+ third drain regions 131 are disposed at intersections of the n-type lattice region.

FIG. 12B shows the reset state. Specifically, when negative voltage is applied to the back gate MG (133) formed of a transparent electrode and the drain electrode MD (134) of the third MOS transistor 135 and positive voltage is applied to the drain D (116) of the detection transistor 123 as the first MOS transistor, holes in the first p⁻-type region 111-1 and a hole pocket remaining in the cell through light irradiation are discharged from the drain electrode MD via the path indicated by the bold full line L1, and electrons remaining in the n⁺ layer and the n-type isolation layer 113 are discharged from the drain D via the path indicated by the bold full line L2.

FIG. 12C shows the transistor plane on which signal output terminals and so on are arranged. In FIG. 12C, the detection transistor 123 having the ring-shape first gate region 117 around the first source region 115 is disposed and the hole drains of the reset transistors 124 are disposed at four corners of the pixel.

Figure 13A:
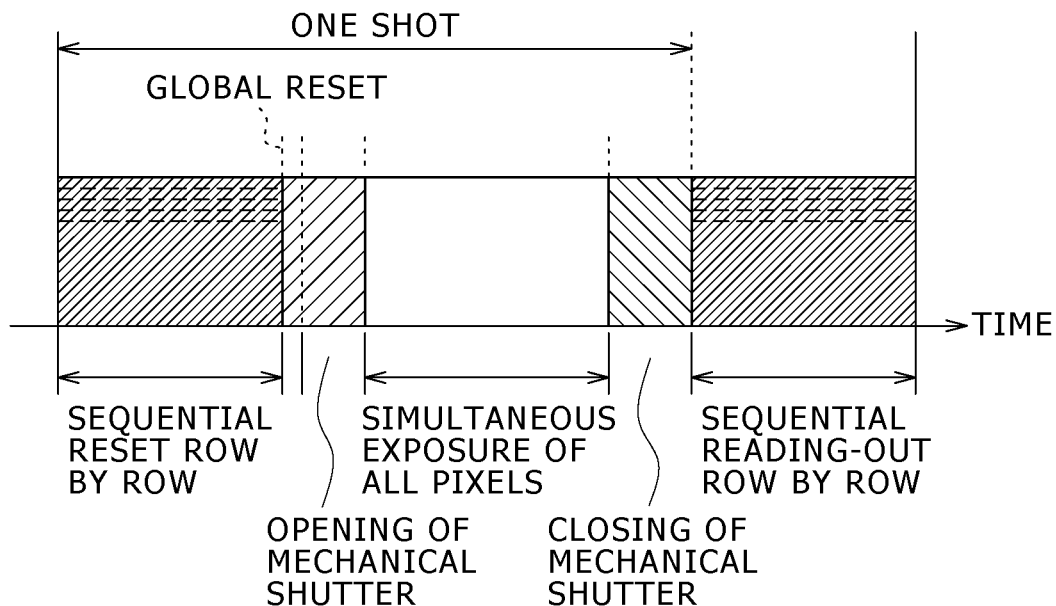
FIGS. 13A and 13B are conceptual diagrams showing global shutter operation with use of the solid-state imaging device according to the third embodiment.
Figure 13B:
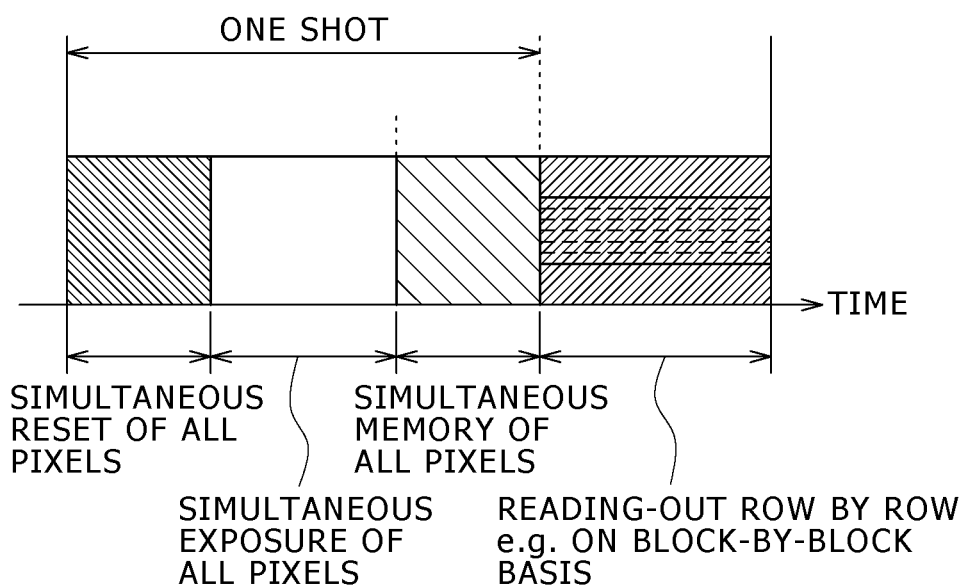

FIGS. 13A and 13B are conceptual diagrams showing global shutter operation with use of the solid-state imaging device according to the third embodiment.

The global shutter refers to a method of simultaneously exposing all of the pixels on one screen without generation of partial time delay. The system of the global shutter in a digital camera is roughly categorized into (1) a system of carrying out shutter operation by the combination of a mechanical shutter and an electronic shutter, and (2) a system of carrying out shutter operation only by an electronic shutter.

FIG. 13A shows an example of the combination of an electronic shutter and a mechanical shutter. FIG. 13B shows an example of an all-electronic shutter with use of a memory. In each diagram, electric operation carried out in an image sensor during the one-time shutter period (one shot) is conceptually shown.

In the example of FIG. 13A, sequential reset for one frame on a row-by-row basis, opening of the mechanical shutter, simultaneous exposure of all the pixels, and closing of the mechanical shutter are carried out. Subsequently, in the case of a CMOS sensor column reading-out system, sequential transferring to floating diffusions (floating sources) of columns on a row-by-row basis is carried out, and reading-out for one frame on a row-by-row basis is carried out, so that the operation of one shot is completed.

The reset operation before the simultaneous exposure of all the pixels is to temporarily evacuate the remaining charge in the pixel and carry out operation such as electron injection according to need to thereby adjust the initial condition for all the pixels.

Most CMOS digital cameras employ this system.

In this case, e.g. the structure of FIG. 2 can be used.

FIG. 13B shows an all-electronic shutter system with use of the structure of FIG. 11. In this system, after simultaneous reset of all the pixels and exposure of all the pixels, the charge is not immediately transferred, but a signal is temporarily stored in the memory part of each pixel during a constant time, followed by being transferred to the source of the detection transistor 123 in each pixel part 2. Thereafter, the signal is read out by a predetermined method.

As the method for reading-out the signals from all the memories, reading-out on a row-by-row basis may be carried out like the example of FIG. 13A. Alternatively, one screen may be divided into plural block regions and reading-out row by row may be carried out on a block-by-block basis. For example, the block at the center of the screen may be defined as the block from which signals are read out first, and signals may be read out from the peripheral blocks subsequently.

Figure 14A:
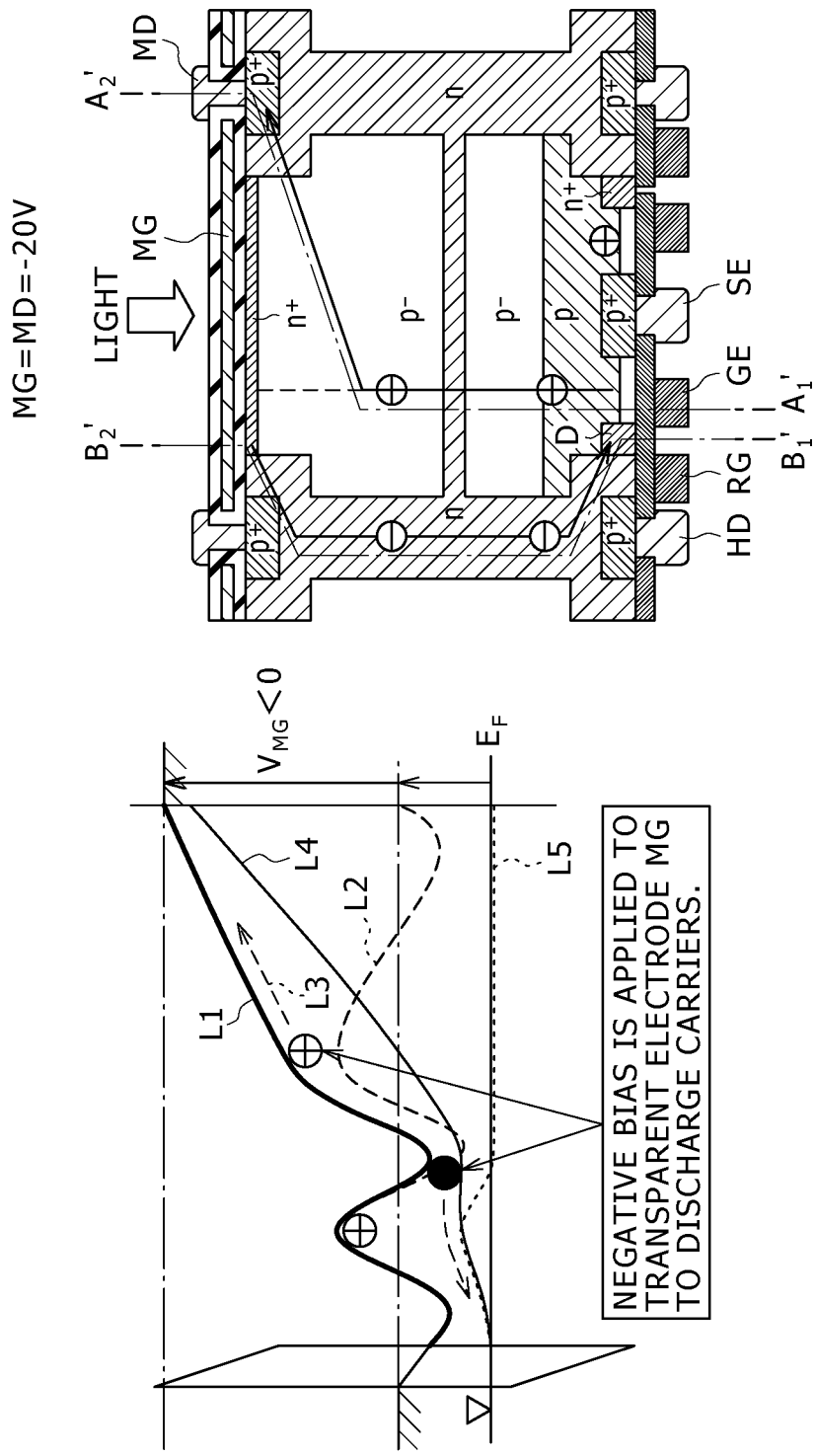
Figure 14B:
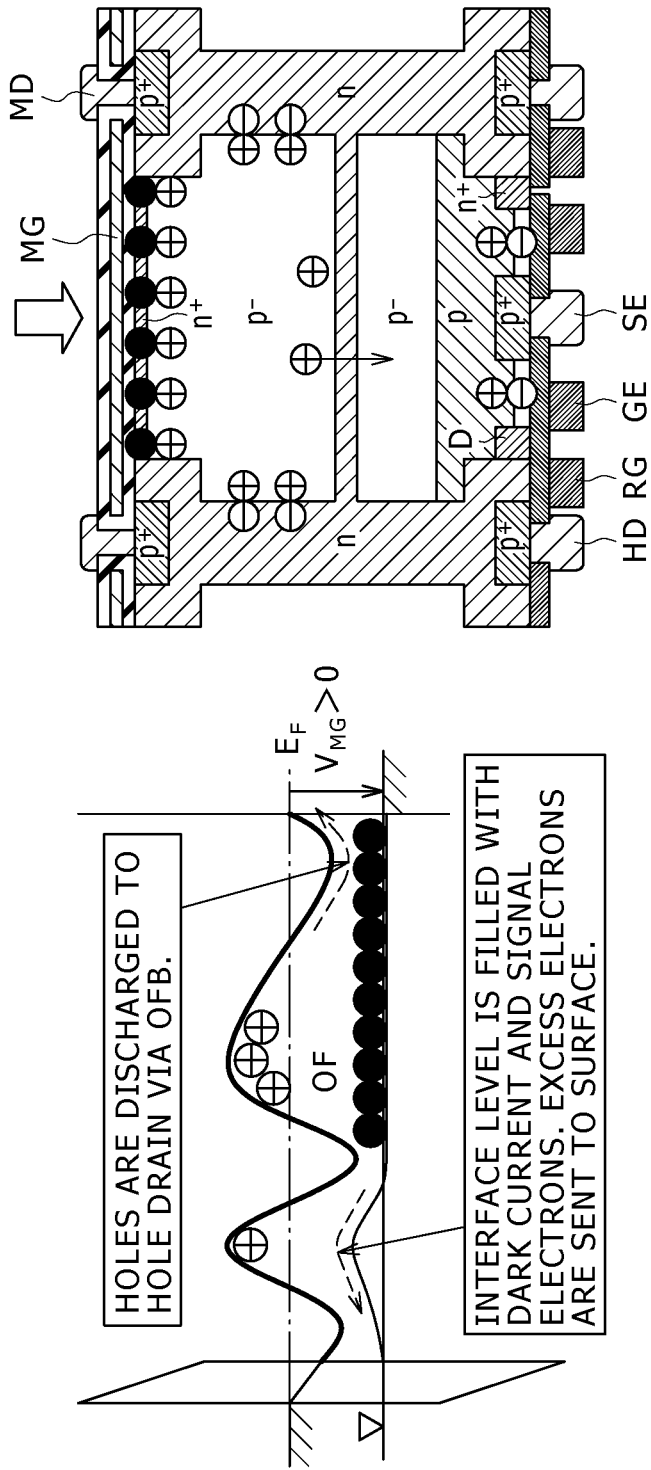

FIGS. 14A to 14C are explanatory diagrams of operation when the solid-state imaging device (image sensor) according to the third embodiment is applied to a global shutter, and show potential changes in the respective regions. FIG. 14A shows the state of global reset. FIG. 14B shows the state of exposure, i.e., the state of light reception and hole accumulation. FIG. 14C shows the state of global set, i.e., the state of carrier transfer.

In the diagrams, the curves indicated as the bold full line L1, the bold dashed line L2, and the bold chain line L3 show potential changes along the line $A_1$-$A_2$ on the element sectional view of FIG. 11 before and after voltage application to the back gate MG and the drain electrode MD and carrier transfer. The curves indicated as the narrow full line L4 and the narrow dashed line L5 show potential changes along the line $B_1$-$B_2$ before and after the voltage application. The full lines show the potential after the voltage application.

(i) Global Reset

When e.g. −20 V is applied to the back gate MG and the drain electrode MD, the potential along the line $A_1$-$A_2$ changes from the dashed-line state to the full-line state, so that carriers (electrons and holes) remaining in the cell are discharged. Specifically, holes in the first p⁻-type region 111-1 and a hole pocket are discharged from the drain electrode MD, and electrons in the n+ layer and the n-type isolation layer 113 are discharged from the drain D (116).

(ii) Light Reception and Accumulation (Memory)

When light is received in the state in which 3 V and 0 V are applied to MG and MD, respectively, holes are accumulated in the first p−-type region 111-1 and the second p−-type region 111-2 due to the photoelectric effect, and a part of the holes in the first p−-type region 111-1 overflow the n-type isolation layer 113 so as to be distributed into the second p−-type region 111-2. On the other hand, electrons are accumulated in the n+ layer 114 above the first p−-type region 111-1, and holes are accumulated in the p− layer in contact with the n+ layer 114. Specifically, the first p−-type region 111-1 functions as a memory cell.

(iii) Global Set (Transfer)

When both MG and MD are set to 0 V in the memory state, most part of electrons are recombined with holes and thus disappear, because the voltage for holding the electrons in the n+ layer 114 is eliminated.

Subsequently, when MG is set to +20 V and MD is set to the Hi-Z (high impedance) state, the holes in the first p−-type region 111-1 (in the first cell) are transferred to the second p−-type region 111-2 (in the second cell) and accumulated in a hole pocket.

Thereafter, the accumulated-charge amount is read out in accordance with the above-described process associated with FIG. 2.

Figure 15:
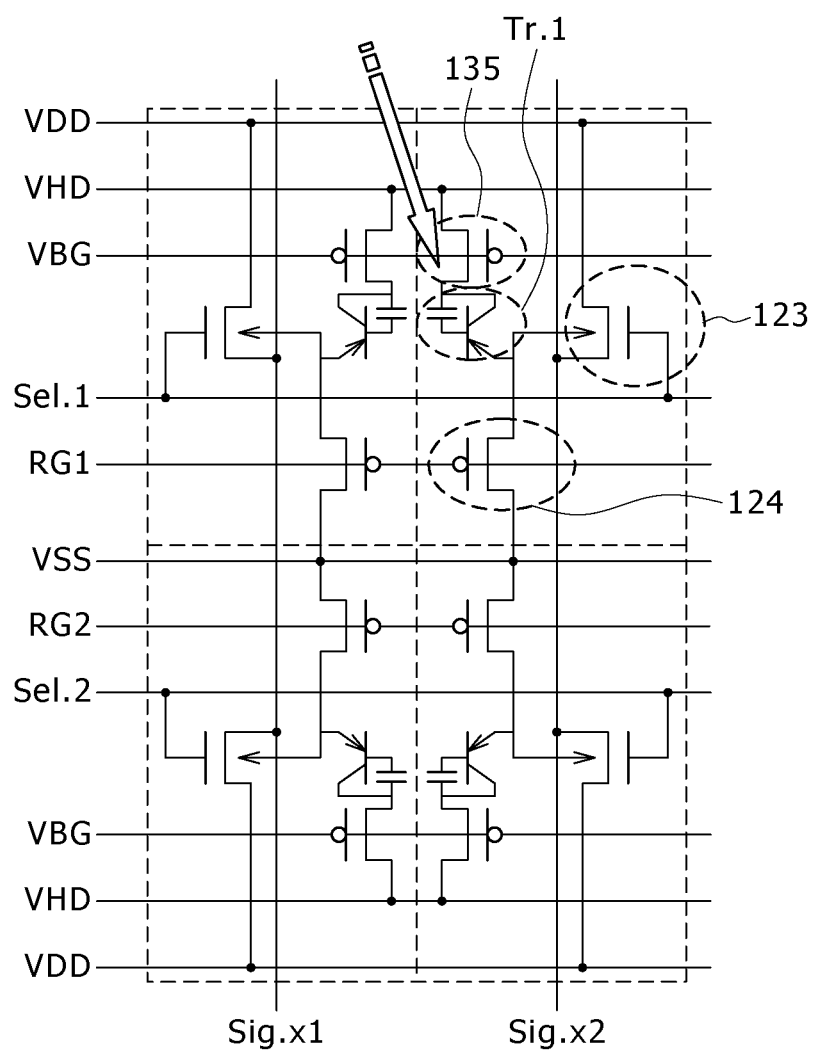
FIG. 15 is a diagram showing four pixels in a circuit arrangement example with use of the device structure of FIG. 11.

FIG. 15 is a diagram showing four pixels in a circuit arrangement example with use of the device structure of FIG. 11.

In this example, two pixels along the X direction (on two rows) and two pixels along the Y direction (on two columns) are disposed based on current mirror arrangement. Such arrangement can halve the number of interconnects for both the interconnects along the X direction and the Y direction.

In this arrangement, a supply voltage VDD is supplied to the drains of the detection transistors 123. A gate signal Sel.1, Sel.2, . . . is supplied to the gates on a column-by-column basis, and a signal Sigx.1, Sigx2, . . . is output from the source on a row-by-row basis.

Furthermore, a reset gate signal RG1, RG2, . . . is supplied to the gates of the reset transistors 124 on a column by column basis, and the drains of plural (four, in the case of FIG. 15) reset transistors are connected to a reference potential VSS in common.

In addition, a hole drain signal VHD is supplied to the drains of the third MOS transistors (memory (pinning) transistors) 135, and a back gate signal VBG is supplied to the gates.

Figure 16:
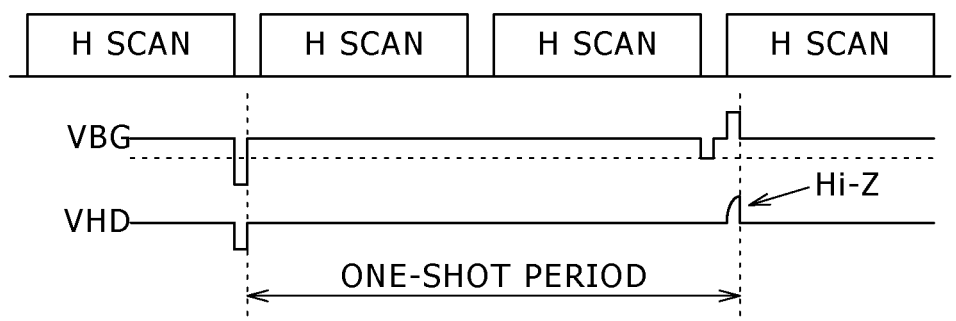
FIG. 16 is a diagram showing an example of the timing chart of global shutter operation with use of the structures of FIGS. 11 and 15.

FIG. 16 is a diagram showing an example of the timing chart of global shutter operation with use of the structures of FIGS. 11 and 15.

In FIG. 16, H SCAN denotes the column horizontal scanning period (of one frame). In the one-shot period, the back gate signal VBG is applied to the back gate MG, and the hole drain signal VHD is applied to the drain electrode.

At the end of the one-shot period, the back gate signal VBG is switched from the low level to the high level of 20 V. At the timing of the switching of the back gate signal VBG to the high level, the signal VHD is turned to the Hi-Z (high impedance) state.

Figure 17:
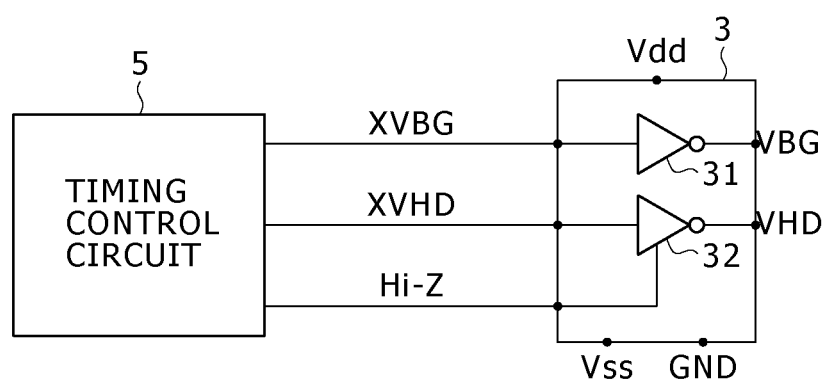
FIG. 17 is a diagram showing an example of the drive circuit for global shutter driving with use of the structures of FIGS. 11 and 15.

FIG. 17 is a diagram showing an example of the drive circuit for global shutter driving with use of the structures of FIGS. 11 and 15.

As shown in FIG. 17, the column-direction (Y-direction) control circuit 3 includes inverters 31 and 32. To the inverter 31, a signal XVBG (X denotes inversion) is supplied from the timing control circuit 5. To the inverter 32, a signal XVHD is supplied from the timing control circuit 5. The inverter 32 is so controlled by the timing control circuit 5 that its output is turned to Hi-Z.

Figure 18:
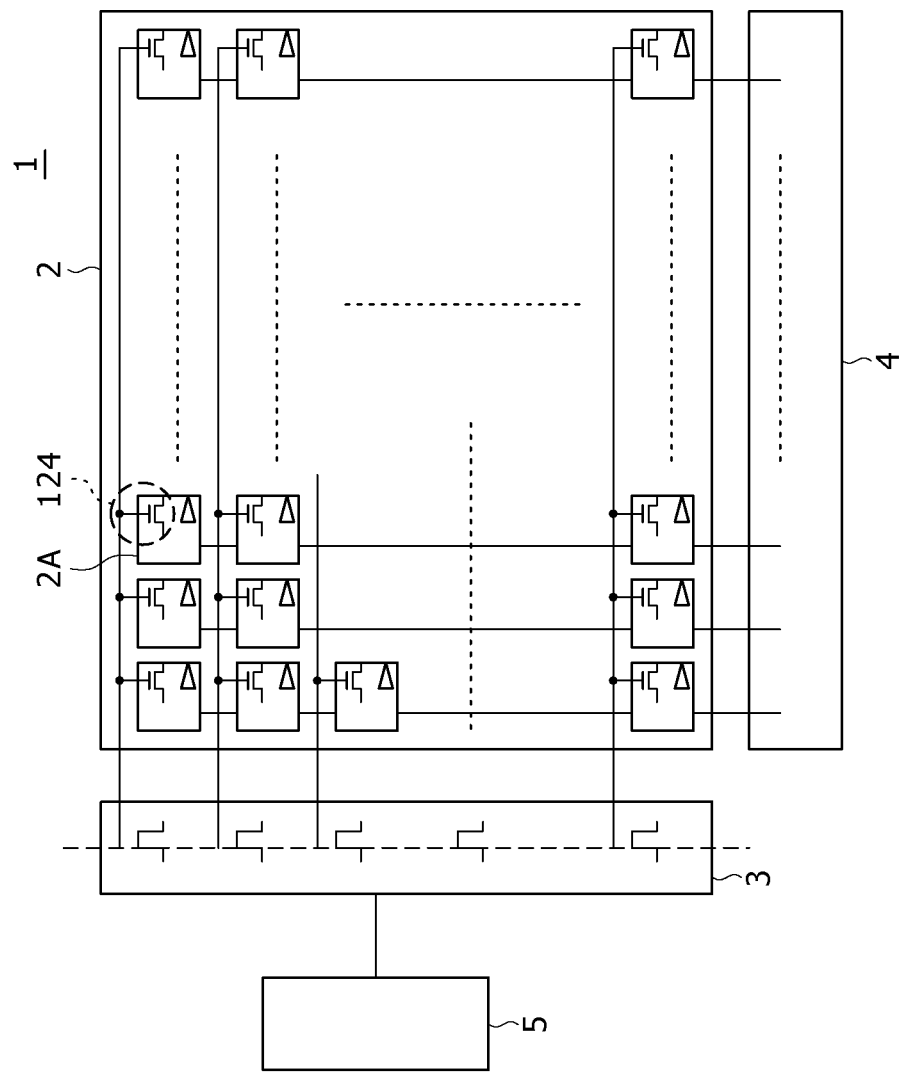
FIG. 18 is an explanatory diagram of simultaneous reset of all the pixels.

FIG. 18 is an explanatory diagram of the simultaneous reset of all the pixels. Specifically, in FIG. 18, the gates of the reset transistors 124 in the pixels on each row are connected in parallel along a respective one of the X lines. To the respective X lines, reset pulses are applied at the same timing from the timing control circuit 5 via the column-direction (Y-direction) control circuit 3.

As described above, according to the third embodiment, the p−-type region 111 in each of the cells isolated from each other by the n-type isolation layer 113 is further divided by the n layer 130 into two regions along the normal direction of the substrate (layer-stacking direction), so that the first p−-type region 111-1 and the second p−-type region 111-2 are formed. Near the first substrate surface 101 of each cell, an n+ layer 114B separated by the n-type isolation layer 113 that has the p+ region 131 selectively formed inside thereof is provided. An electrode is provided on the p+ region 131 adjacent to the first substrate surface 101. The first region 201 including the first p−-type region 111-1 near the first substrate surface 101 functions as a charge generating and charge holding region. The second region 202 (p-type region) including the second p−-type region 112 near the second substrate surface 102 functions as a detection region. Due to this structure, in addition to the above-described advantageous effects by the first embodiment, a global shutter based on an all-electronic shutter system without a mechanical shutter can be realized.

Furthermore, it is also possible to employ a silicon-on-insulator (SOI) process.

Figure 19:
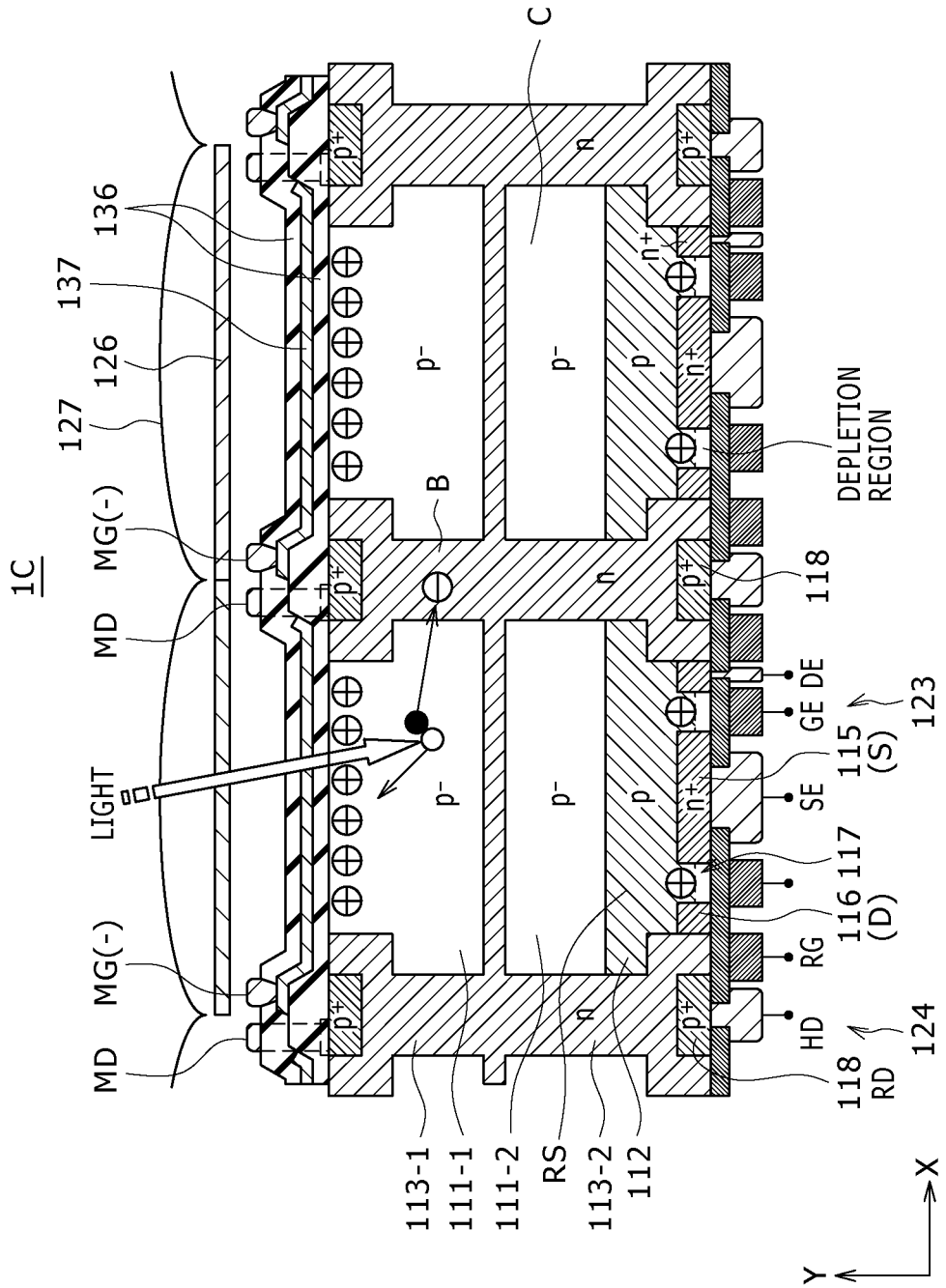
FIG. 19 is a schematic sectional view showing the basic structure of a pixel part in a solid-state imaging device according to a fourth embodiment of the present invention.

FIG. 19 is a schematic sectional view showing the basic structure of the pixel part in a solid-state imaging device according to a fourth embodiment of the present invention. Two pixel parts are shown also in FIG. 19.

A solid-state imaging device 1C according to the fourth embodiment is different from the solid-state imaging device 1B (FIG. 11) according to the third embodiment, in that a transparent electrode 137 composed of e.g. ITO is disposed with the intermediary of an insulating film 136 formed of e.g. an oxide film, instead of the n+ layer 114B near the first substrate surface 101 of the substrate 100.

In this device, if negative voltage is applied to the transparent electrode (back gate MG) 137 at the time of light irradiation, photo-holes are attracted toward the substrate surface and can be temporarily pinned during the application of the negative voltage to the back gate MG.

The above-described embodiments relate to a CMD structure.

However, by interchanging the conductivity types of the respective layers between the p-type and n-type in the solid-state imaging devices having a memory function according to the third and fourth embodiments, embodiments of the present invention can also be applied to a complementary sensor device that has a hole-accumulating photodiode (hole accumulate diode (HAD)) structure including a floating diffusion layer (floating diffusion) FD.

Figure 20:
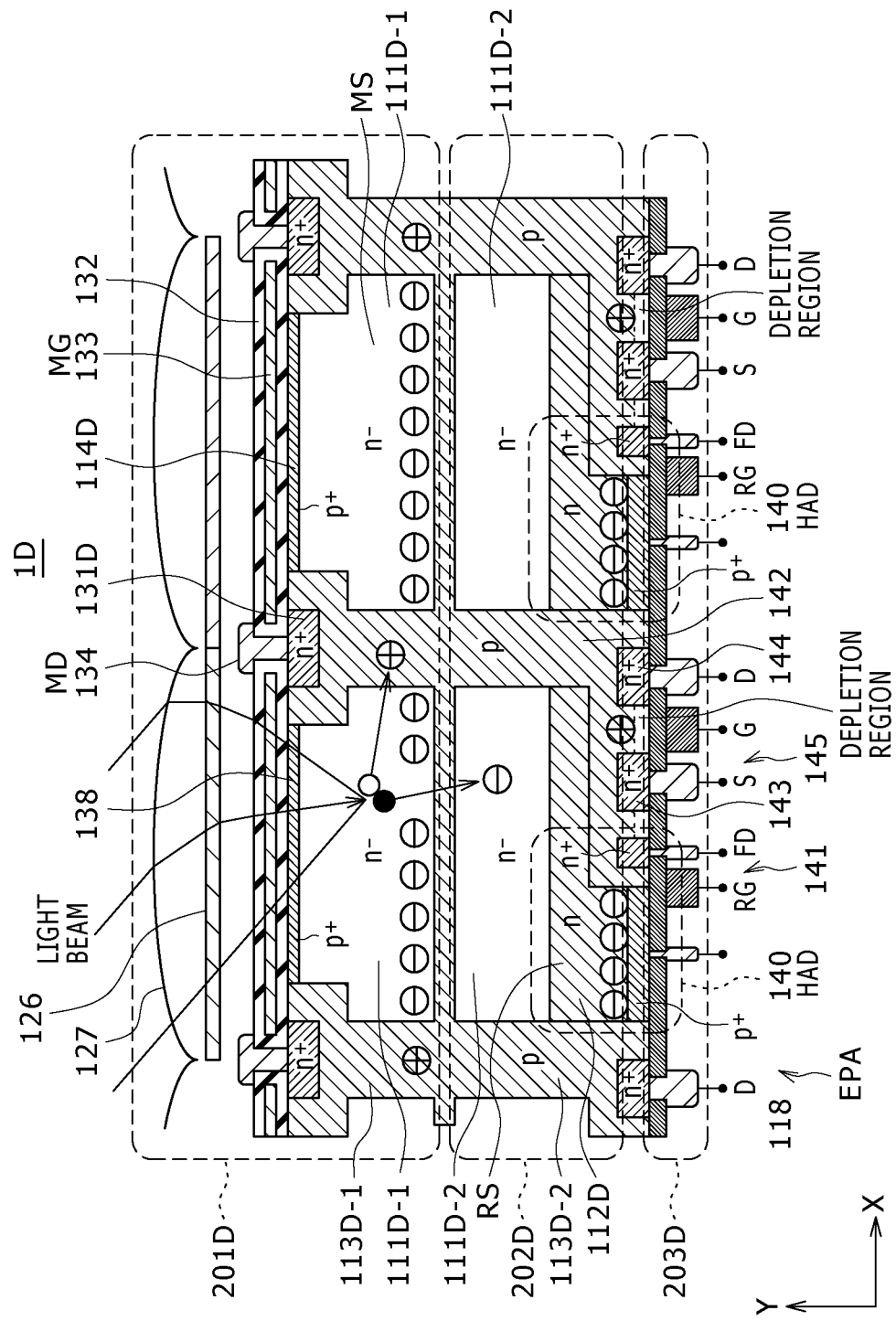
FIG. 20 is a schematic sectional view showing the basic structure of a pixel part in a solid-state imaging device according to a fifth embodiment of the present invention.

FIG. 20 is a schematic sectional view showing the basic structure of the pixel part in a solid-state imaging device according to a fifth embodiment of the present invention. Two pixel parts are shown also in FIG. 20.

A solid-state imaging device 1D according to the fifth embodiment is different from the solid-state imaging device 1B (FIG. 11) according to the third embodiment, in that the solid-state imaging device 1D has a complementary sensor structure and is so configured as to use, of photo-carriers, electrons as a first accumulated charge and holes as a second accumulated charge.

In the solid-state imaging device 1D, the conductivity types of the semiconductor are opposite to those in the structures of FIGS. 11 and 19. A $p^+$ layer 138 is provided in the element area part EAP near the first substrate surface 101, and a HAD sensor (surrounded by the bold dashed line) 140 is disposed in a second region 202D.

In this case, the signal charge is electrons. Applying positive voltage to the reset gate electrode RG makes it possible to extract the electron charge to the floating diffusion (FD) 141 and read out the signal charge.

On the other hand, holes are accumulated in a potential well formed in the vicinity of the semiconductor surface under a gate 145 between a source 143 and a drain 144 formed as components of a detection transistor in a p-type layer (well) 142 as an extension of the second region 202D. Thus, it is also possible to carry out signal detection based on modulated current flowing between the source and drain (S-D).

Figure 21:
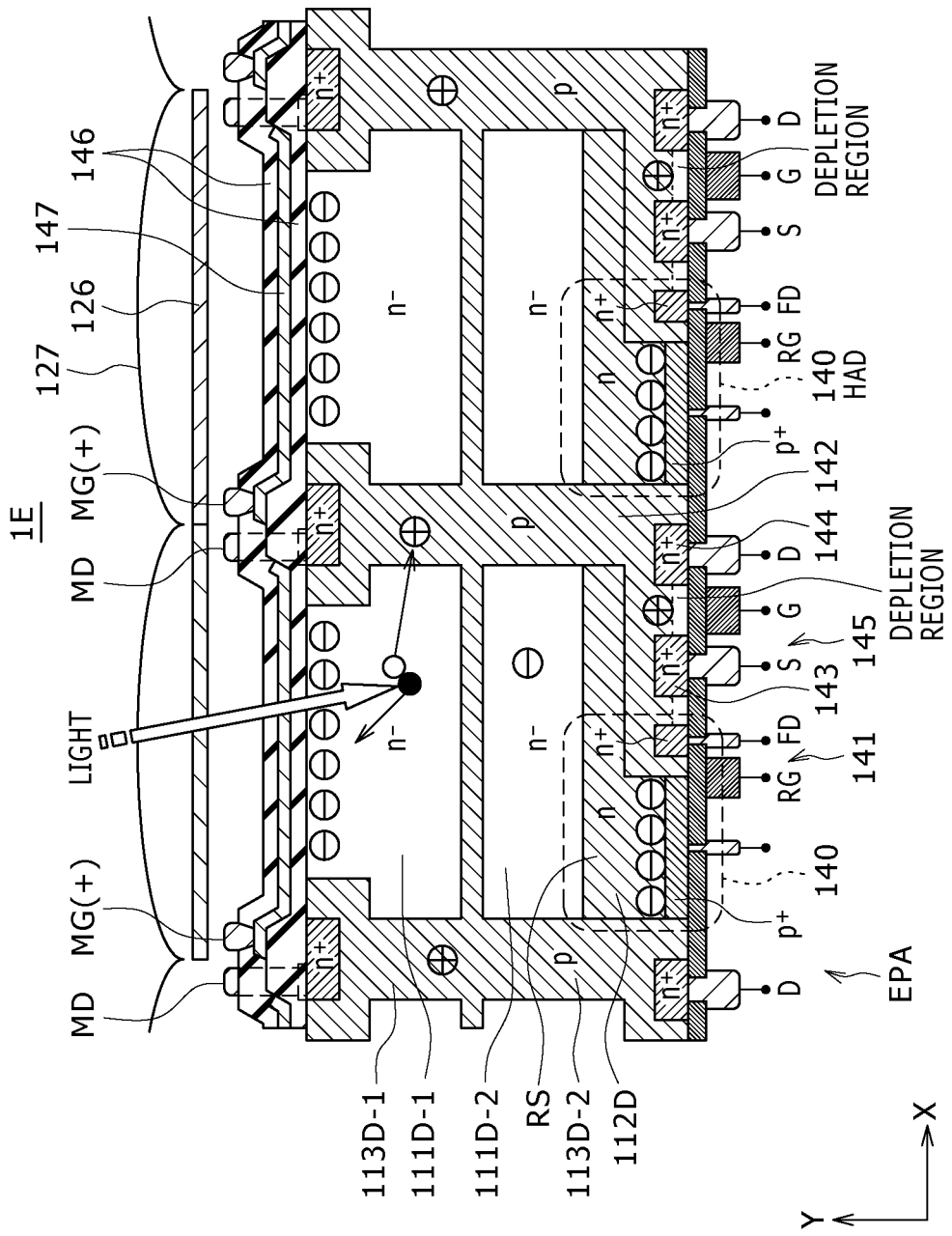
FIG. 21 is a schematic sectional view showing the basic structure of a pixel part in a solid-state imaging device according to a sixth embodiment of the present invention.

FIG. 21 is a schematic sectional view showing the basic structure of the pixel part in a solid-state imaging device according to a sixth embodiment of the present invention. Two pixel parts are shown also in FIG. 21.

A solid-state imaging device 1E according to the sixth embodiment is different from the solid-state imaging device 1D (FIG. 20) according to the fifth embodiment, in that a transparent electrode 147 is disposed with the intermediary of an insulating film 146 instead of the $p^+$ layer 138 near the first substrate surface 101.

In this device, when positive voltage is applied to the transparent electrode 147 at the time of light irradiation, electrons arising from the photoelectric effect are attracted toward the first substrate surface 101 and can be temporarily pinned during the application of the positive voltage to the back gate MG.

Moreover, the HAD sensor (surrounded by the bold dashed line) 140 is disposed in the second region 202D. Thus, similarly to the device of FIG. 20, the signal charge can be read out from the floating diffusion (FD) 141.

Furthermore, similarly to the device of FIG. 20, holes are accumulated in a potential well formed in the vicinity of the semiconductor surface under the gate 145 between the source 143 and the drain 144 formed in the p-type well 142 in the second region 202D. Thus, it is also possible to carry out signal detection based on modulated current flowing between the source and drain (S-D).

As the insulating film formed on the first substrate surface 101 in FIGS. 10, 19, and 21, a film having a negative fixed charge, specifically e.g. an insulating film at least a part of which is crystallized, can be used.

Examples of the insulating film at least a part of which is crystallized include an insulating film that is composed of an oxide of an element such as hafnium, zirconium, aluminum, tantalum, titanium, yttrium, or lanthanoid and includes a region arising from the crystallization of at least a part of the film.

The thickness of the insulating film at least a part of which is crystallized can be in the range of 3 nm to 100 nm. A thickness smaller than 3 nm makes the crystallization difficult. The upper limit of the thickness is about 100 nm in practical use, and larger thickness is unnecessary. A thickness of several tens of nanometers is the most suitable in terms of optical factors such as the transmittance.

At the interface between the above-described crystallized insulating film and the light-reception plane of the light-receiving part 110, a required insulating film having a small thickness is formed. In the above-described examples, a silicon oxide film is formed. In the case of a hafnium oxide film as the crystallized insulating film, a negative charge is formed in the film through crystallization annealing at a required temperature. This crystallized insulating film has a potential control function to control the potential of the light-reception plane of the light-receiving part 110.

The refractive index of e.g. the hafnium oxide film as the crystallized insulating film is about 2.0, and that of the insulating film thereon (silicon oxide film) is about 1.45. Therefore, an anti-reflection film is formed by the crystallized insulating film (hafnium oxide film) and the insulating film (silicon oxide film).

By forming a film having a negative fixed charge, such as an insulating film at least a part of which is crystallized, on the light-reception plane of the light-receiving part 110 in this manner, the surface of the photodiode can be turned to a hole-accumulating state. This can suppress a dark current component attributed to the interface state. Furthermore, the photodiode surface can be turned to a hole-accumulating state without ion-implantation and annealing for formation of the hole-accumulating layer, or even with a small dose amount, and thus dark current attributed to the interface state can be suppressed. Moreover, an anti-reflection film is formed by the film having a negative fixed charge such as a crystallized insulating film (e.g. hafnium oxide film) and an insulating film thereon (silicon oxide film), which can realize small dark current and high sensitivity.

As described above, according to the embodiments, a pixel having a cell structure is irradiated with light from the substrate backside to thereby accumulate optical signal carriers in a semiconductor layer of a second conductivity type formed on a semiconductor substrate of a first conductivity type, and the signal is extracted through threshold modulation of a transistor. In addition, by providing a lateral overflow structure (drain, gate), control of crosstalk and the saturated charge amount is carried out.

Therefore, the embodiments can efficiently carry out at high speed a series of operation including generation and accumulation of photo-carriers, charge reading-out, and sending-out of the residual charge (reset).

In addition, the embodiments allow sensitivity enhancement and pixel miniaturization while preventing the deterioration of the sensitivity to blue light and the influence of trapping of photo-carriers at the silicon interface.

The solid-state imaging devices having the above-described features can be used as imaging devices in digital cameras and video cameras.

Figure 22:
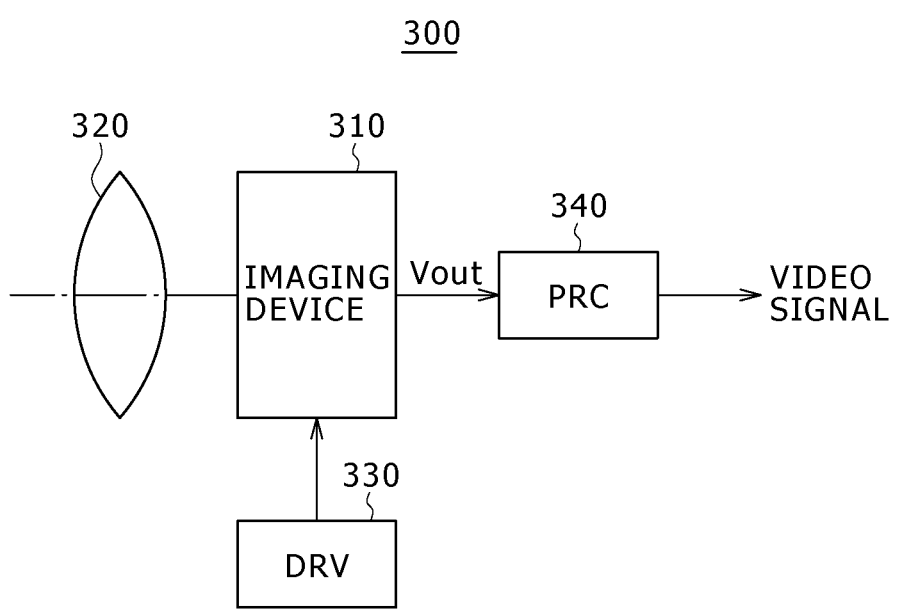
FIG. 22 is a diagram showing one example of the configuration of a camera system to which the solid-state imaging device according to any of the embodiments is applied.

FIG. 22 is a diagram showing one example of the configuration of a camera system to which the solid-state imaging device according to any of the embodiments of the present invention is applied.

As shown in FIG. 22, this camera system 300 includes an imaging device 310 as which any of the solid-state imaging devices 1 and 1A to 1E according to the embodiments can be used, a lens 320 for focusing incident light (image light) on the imaging plane as an optical system for guiding the incident light to the pixel area of the imaging device 310 (forming a subject image), a drive circuit (DRV) 330 for driving the imaging device 310, and a signal processing circuit (PRC) 340 for processing an output signal from the imaging device 310.

The drive circuit 330 has a timing generator (not shown) that produces various timing signals including start pulse and clock pulse for driving the circuit in the imaging device 310, to thereby drive the imaging device 310 by the predetermined timing signal.

The signal processing circuit 340 executes signal processing such as correlated double sampling (CDS) for the output signal from the imaging device 310.

The video signal resulting from the processing by the signal processing circuit 340 is recorded to a recording medium such as a memory. The video information recorded to the recording medium is subjected to a hard copy by a printer. Furthermore, the video signal resulting from the processing by the signal processing circuit 340 is displayed as a moving image on a monitor formed of e.g. a liquid crystal display.

As described above, a high-accuracy camera can be realized by providing imaging apparatus such as a digital still camera with any of the solid-state imaging devices 1 and 1A to 1E as the imaging device 310.

The present embodiment is not limited to the above description of the embodiments.

For example, the numerical values and materials employed in the embodiments are merely one example, and the embodiment is not limited thereto.

Various changes might be incorporated in the embodiments without departing the gist of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A back-illuminated solid-state imaging device comprising:
   a substrate having a back substrate surface irradiated with light and a front substrate surface on which an element, including a plurality of transistors, is formed;
   a light-receiving part in the substrate and including a first-conductivity-type conductive layer, the light-receiving part receiving light through the back substrate surface and having a photoelectric conversion function for received light and a charge accumulation function;
   a second-conductivity-type isolation layer on a side of the first-conductivity-type conductive layer of the light-receiving part in a thickness direction of the substrate;
   a detection transistor on the front substrate surface, the detection transistor including a second-conductivity-type electrode layer formed in the first-conductivity-type conductive layer near the front substrate surface, the detection transistor detecting an accumulated charge in the light-receiving part and having a threshold modulation function; and
   a reset transistor on the front substrate surface, the reset transistor including (a) a first-conductivity-type electrode layer formed in the second-conductivity-type isolation layer, (b) a portion of the second-conductivity-type isolation layer between the first-conductivity-type electrode layer and the second-conductivity-type electrode layer of the detection transistor, and (c) a portion of the first-conductivity-type conductive layer of the light-receiving part,
   wherein,
      the first-conductivity-type conductive layer of the light-receiving part in a pixel cell isolated by the second-conductivity-type isolation layer is divided by a second-conductivity-type layer into a first region and a second region, the first and second regions arranged in a thickness direction of the substrate, and the first region closer to the back substrate surface than the second region,
      a second first-conductivity-type electrode layer adjacent to the back substrate surface is formed in a portion of the second-conductivity-type isolation layer on a side of the first region along a direction parallel to the back substrate surface, and
      the back-illuminated solid-state imaging device further comprises (1) a transparent electrode on a light-incident side of the back substrate surface, to which bias voltage for developing a pinning function is applied, and (2) a memory transistor on the back substrate surface, the memory transistor including (a) the second first-conductivity-type electrode layer, (b) the first region of the light-receiving part, (c) a portion of the second-conductivity-type isolation layer between the first region of the light-receiving part and the second first-conductivity-type electrode layer, and (d) the transparent electrode serving as a gate of the memory transistor.

2. The back-illuminated solid-state imaging device according to claim 1, wherein the first-conductivity-type conductive layer includes:
   a first first-conductivity-type conductive layer that is near the back substrate surface, and
   a second first-conductivity-type conductive layer that is closer to the front substrate surface than the first first-conductivity-type conductive layer.

3. The back-illuminated solid-state imaging device according to claim 2, wherein an impurity concentration of the first first-conductivity-type conductive layer is lower than an impurity concentration of the second first-conductivity-type conductive layer.

4. The back-illuminated solid-state imaging device according to claim 1, further comprising a second second-conductivity-type layer on the back substrate surface, wherein the second second-conductivity-type layer has an impurity concentration higher than an impurity concentration of the second-conductivity-type isolation layer.

5. The back-illuminated solid-state imaging device according to claim 1, wherein the second-conductivity-type isolation layer has a cell isolation function and a function to discharge, of the charge generated by the first-conductivity-type conductive layer of the light-receiving part, an unnecessary charge via the second-conductivity-type electrode layer of the detection transistor adjacent to the second-conductivity-type isolation layer.

6. The back-illuminated solid-state imaging device according to claim 1, wherein:
   the first region functions as a charge generating and charge holding region, and
   the second region functions as a detection region.

7. A back-illuminated solid-state imaging device comprising:
   a substrate having a back substrate surface irradiated with light and a front substrate surface on which an element, including a plurality of transistors, is formed;
   a light-receiving part in the substrate and including a first-conductivity-type conductive layer, the light-receiving part receiving light through the back substrate surface and having a photoelectric conversion function for received light and a charge accumulation function;
   a second-conductivity-type isolation layer on a side of the first-conductivity-type conductive layer of the light-receiving part in a thickness direction of the substrate;
   a detection transistor on the front substrate surface, the detection transistor including a second-conductivity-type electrode layer formed in the first-conductivity-type conductive layer near the front substrate surface, the detection transistor detecting an accumulated charge in the light-receiving part and having a threshold modulation function; and a reset transistor on the front substrate surface, the reset transistor including (a) a first-conductivity-type electrode layer formed in the second-conductivity-type isolation layer, (b) a portion of the second-conductivity-type isolation layer between the first-conductivity-type electrode layer and the second-conductivity-type electrode layer of the detection transistor, and (c) a portion of the first-conductivity-type conductive layer of the light-receiving part, wherein,
- a first source region of a second conductivity type is formed in the first-conductivity-type conductive layer near the front substrate surface in each of pixel cells isolated from each other by the second-conductivity-type isolation layer, and a first drain region of the second conductivity type is formed to surround the first source region,
- one side of the first drain region overlaps with a partial portion of the second-conductivity-type isolation layer along a direction parallel to the front substrate surface,
- a first gate region surrounded by the first source region and the first drain region is formed,
- a second drain region formed of the first-conductivity-type electrode layer is formed in the second-conductivity-type isolation layer, and a second-conductivity-type region surrounded by the first drain region and the second drain region serves as a second gate region,
- an insulating film is selectively formed on the front substrate surface of the substrate in which the first source region, the first drain region, the first gate region, the second drain region, and the second gate region are formed,
- the detection transistor comprising the first source region, the first gate region, and the first drain region, and the reset transistor comprising the second gate region, the second drain region, and the portion of the first-conductive-type conductive layer as a source are formed across the front substrate surface,
- the first-conductivity-type conductive layer of the light-receiving part in a pixel cell isolated by the second-conductivity-type isolation layer is divided by a second-conductivity-type layer into a first region and a second region, the first and second regions arranged in a thickness direction of the substrate, and the first region closer to the back substrate surface than the second region,
- a third drain region as a second first-conductivity-type electrode layer is formed adjacent to the back substrate surface in a portion of the second-conductivity-type isolation layer on a side of the first region along a direction parallel to the back substrate surface, and
- the back-illuminated solid-state imaging device further comprises (1) a transparent electrode on a light-incident side of the back substrate surface, to which bias voltage for developing a pinning function is applied, and (2) a memory transistor on the back substrate surface, the memory transistor including (a) the third drain region, (b) the first region of the light-receiving part serving as a source of the memory transistor, (c) a portion of the second-conductivity-type isolation layer between the first region of the light-receiving part and the third drain region, and (d) the transparent electrode serving as a gate of the memory transistor.

8. The back-illuminated solid-state imaging device according to claim 7, wherein the first-conductivity-type conductive layer includes:
- a first first-conductivity-type conductive layer that is near the back substrate surface, and
- a second first-conductivity-type conductive layer that is closer to the front substrate surface than the first first-conductivity-type conductive layer.

9. The back-illuminated solid-state imaging device according to claim 8, wherein an impurity concentration of the first first-conductivity-type conductive layer is lower than an impurity concentration of the second first-conductivity-type conductive layer.

10. The back-illuminated solid-state imaging device according to claim 7, wherein the first gate region surrounded by the first source region and the first drain region has a ring shape.

11. The back-illuminated solid-state imaging device according to claim 7, wherein the second-conductivity-type isolation layer has a cell isolation function and a function to discharge, of the charge generated by the first-conductivity-type conductive layer of the light-receiving part, an unnecessary charge via the first drain region of the detection transistor adjacent to the second-conductivity-type isolation layer.

12. The back-illuminated solid-state imaging device according to claim 11, wherein the detection transistor has a function to amplify and detect a signal arising from light irradiation through modulation of channel electron current between the first source region and the first drain region dependent upon a charge amount of holes collected in a hole pocket.

13. The back-illuminated solid-state imaging device according to claim 12, wherein:
- a plurality of the reset transistors are disposed around the detection transistor, and
- each of the reset transistors discharges holes collected in a first-conductivity-type well and the hole pocket to the second drain region laterally to a semiconductor substrate surface in response to application of voltage of predetermined polarity to the second gate region and the second drain region.

14. The back-illuminated solid-state imaging device according to claim 7, further comprising:
- a second second-conductivity-type layer on the back substrate surface, wherein the second second-conductivity-type layer has an impurity concentration higher than an impurity concentration of the second-conductivity-type isolation layer.

15. A back-illuminated solid-state imaging device comprising:
- a substrate having a back substrate surface irradiated with light and a front substrate surface on which an element, including a plurality of transistors, is formed;
- a light-receiving part in the substrate and including a first-conductivity-type conductive layer, the light-receiving part receiving light through the back substrate surface and having a photoelectric conversion function for received light and a charge accumulation function;
- a second-conductivity-type isolation layer on a side of the first-conductivity-type conductive layer of the light-receiving part in a thickness direction of the substrate; and
- an element area part on the front substrate surface and configured to process an accumulated charge, the element area part including a detection transistor detecting an accumulated charge in the light-receiving part and a reset transistor, wherein,
the first-conductivity-type conductive layer of the light-receiving part in a pixel cell isolated by the second-conductivity-type isolation layer is divided by a second-conductivity-type layer into a first region and a second region, the first and second regions arranged in a thickness direction of the substrate, and the first region closer to the back substrate surface than the second region,
a second first-conductivity-type electrode layer adjacent to the back substrate surface is formed in a portion of the second-conductivity-type isolation layer on a side of the first region along a direction parallel to the back surface, and
the back-illuminated solid-state imaging device further comprises (1) a transparent electrode on a light-incident side of the back-substrate surface, to which bias voltage for developing a pinning function is applied, and (2) a memory transistor on the back substrate surface, the memory transistor including (a) the first-conductivity-type electrode layer, (b) the first region of the light-receiving part, (c) a portion of the second-conductivity-type isolation layer between the first region of the light-receiving part and the first-conductivity-type electrode layer and (d) the transparent electrode serving as a gate of the memory transistor.

16. A camera comprising:
a back-illuminated solid-state imaging device including a substrate having a back substrate surface irradiated with light and a front substrate surface on which an element, including a plurality of transistors, is formed, the back-illuminated solid-state imaging device configured to receive light through the back substrate surface;
an optical system configured to guide incident light to the back substrate surface of the back-illuminated solid-state imaging device; and
a signal processing circuit configured to process an output signal from the back-illuminated solid-state imaging device,
wherein,
the back-illuminated solid-state imaging device includes:
(a) a light-receiving part that is in the substrate and includes a first-conductivity-type conductive layer, the light-receiving part receiving light through the back substrate surface and having a photoelectric conversion function for received light and a charge accumulation function,
(b) a second-conductivity-type isolation layer that is on a side of the first-conductivity-type conductive layer of the light-receiving part in a thickness direction of the substrate,
(c) a detection transistor on the front substrate surface, the detection transistor including a second-conductivity-type electrode layer formed in the first-conductivity-type conductive layer near the front substrate surface, the detection transistor detecting an accumulated charge in the light-receiving part and having a threshold modulation function,
(d) a reset transistor on the front substrate surface, the reset transistor including (i) a first-conductivity-type electrode layer formed in the second-conductivity-type isolation layer, (ii) a portion of the second-conductivity-type isolation layer between the first-conductivity-type electrode layer and the second-conductivity-type electrode layer of the detection transistor, and (iii) a portion of the first-conductivity-type conductive layer of the light-receiving part,
wherein,
the first-conductivity-type conductive layer of the light-receiving part in a pixel cell isolated by the second-conductivity-type isolation layer is divided by a second-conductivity-type layer into a first region and a second region, the first and second regions arranged in a thickness direction of the substrate, and the first region closer to the back substrate surface than the second region,
a second first-conductivity-type electrode layer adjacent to the back substrate surface is formed in a portion of the second-conductivity-type isolation layer on a side of the first region along a direction parallel to the back substrate surface, and
the back-illuminated solid-state imaging device further comprises (1) a transparent electrode on a light-incident side of the back substrate surface, to which bias voltage for developing a pinning function is applied, and (2) a memory transistor on the back substrate surface, the memory transistor including (a) the second first-conductivity-type electrode layer, (b) the first region of the light-receiving part, (c) a portion of the second-conductivity-type isolation layer between the first region of the light-receiving part and the second first-conductivity-type electrode layer, and (d) the transparent electrode serving as a gate of the memory transistor.

17. A camera comprising:
a back-illuminated solid-state imaging device including a substrate having a back substrate surface irradiated with light and a front substrate surface on which an element, including a plurality of transistors, is formed, the back-illuminated solid-state imaging device configured to receive light through the back substrate surface;
an optical system configured to guide incident light to the back substrate surface of the back-illuminated solid-state imaging device; and
a signal processing circuit configured to process an output signal from the back-illuminated solid-state imaging device,
wherein,
the back-illuminated solid-state imaging device includes:
(a) a light-receiving part that is in the substrate and includes a first-conductivity-type conductive layer, the light-receiving part receiving light through the back substrate surface and having a photoelectric conversion function for received light and a charge accumulation function,
(b) a second-conductivity-type isolation layer that is on a side of the first-conductivity-type conductive layer of the light-receiving part in a thickness direction of the substrate,
(c) a detection transistor on the front substrate surface, the detection transistor including a second-conductivity-type electrode layer formed in the first-conductivity-type conductive layer near the front substrate surface, the detection transistor detecting an accumulated charge in the light-receiving part and having a threshold modulation function, and
(d) a reset transistor on the front substrate surface, the reset transistor including (i) a first-conductivitytype electrode layer formed in the second-conductivity-type isolation layer, (ii) a portion of the second-conductivity-type isolation layer between the first-conductivity-type electrode layer and the second-conductivity-type electrode layer of the detection transistor, and (iii) a portion of the first-conductivity-type conductive layer of the light-receiving part, wherein, a first source region of a second conductivity type is formed in the first-conductivity-type conductive layer near the front substrate surface in each of pixel cells isolated from each other by the second-conductivity-type isolation layer, and a first drain region of the second conductivity type is formed to surround the first source region, one side of the first drain region overlaps with a partial portion of the second-conductivity-type isolation layer along a direction parallel to the front substrate surface, a first gate region surrounded by the first source region and the first drain region is formed, a second drain region formed of the first-conductivity-type electrode layer is formed in the second-conductivity-type isolation layer, and a second-conductivity-type region surrounded by the first drain region and the second drain region serves as a second gate region, an insulating film is selectively formed on the front substrate surface of the substrate in which the first source region, the first drain region, the first gate region, the second drain region, and the second gate region are formed, the detection transistor comprising the first source region, the first gate region, and the first drain region, and the reset transistor comprising the second gate region, the second drain region, and the portion of the first-conductive-type conductive layer as a source are formed across the front substrate surface, the first-conductivity-type conductive layer of the light-receiving part in a pixel cell isolated by the second-conductivity-type isolation layer is divided by a second-conductivity-type layer into a first region and a second region, the first and second regions arranged in a thickness direction of the substrate, and the first region closer to the back substrate surface than the second region, a third drain region as a second first-conductivity-type electrode layer is formed adjacent to the back substrate surface in a portion of the second-conductivity-type isolation layer on a side of the first region along a direction parallel to the back substrate surface, and the back-illuminated solid-state imaging device further comprises (1) a transparent electrode on a light-incident side of the back substrate surface, to which bias voltage for developing a pinning function is applied, and (2) a memory transistor on the back substrate surface, the memory transistor including (a) the third drain region, (b) the first region of the light-receiving part serving as a source of the memory transistor, (c) a portion of the second-conductivity-type isolation layer between the first region of the light-receiving part and the third drain region, and (d) the transparent electrode serving as a gate of the memory transistor.

* * * * *